United States Patent
Heimann et al.

(12) 
(10) Patent No.: US 6,322,687 B1
(45) Date of Patent: Nov. 27, 2001

(54) ELECTROLYTIC PROCESS FOR FORMING A MINERAL

(75) Inventors: Robert L. Heimann, Centralia; William M. Dalton, Moberly; John Hahn, Columbia, all of MO (US); David M. Price, West Chester, OH (US); Wayne L. Soucie, Columbia, MO (US)

(73) Assignee: Elisha Technologies Co LLC, Moberly, MO (US)

( * ) Notice: Subject to any disclaimer, the term of this patent is extended or adjusted under 35 U.S.C. 154(b) by 0 days.

(21) Appl. No.: 09/532,982

(22) Filed: Mar. 22, 2000

Related U.S. Application Data

(63) Continuation-in-part of application No. 09/369,780, filed on Aug. 6, 1999, now Pat. No. 6,153,080, which is a continuation-in-part of application No. 09/122,002, filed on Jul. 24, 1998, now Pat. No. 6,258,243, which is a continuation-in-part of application No. 09/016,250, filed on Jan. 30, 1998, now Pat. No. 6,149,794.

(60) Provisional application No. 60/036,024, filed on Jan. 31, 1997, and provisional application No. 60/045,446, filed on May 2, 1997.

(51) Int. Cl.$^7$ ...................................................... C25D 9/00
(52) U.S. Cl. .................. 205/316; 205/320; 205/704; 205/199
(58) Field of Search ........................... 205/333, 320–323, 205/316–319, 735, 704, 199

(56) References Cited

U.S. PATENT DOCUMENTS

| | | |
|---|---|---|
| 3,687,740 | 8/1972 | Pearlstein et al. . |
| 4,105,511 | 8/1978 | Nikaido et al. . |
| 4,169,916 | 10/1979 | Tsutsui et al. . |

(List continued on next page.)

FOREIGN PATENT DOCUMENTS

| | | |
|---|---|---|
| 26 40 419 | 3/1977 | (DE) . |
| 53060937 | 5/1978 | (JP) . |
| 61057654 | 3/1986 | (JP) . |
| 60161460 | 8/1987 | (JP) . |
| 1149980 | 6/1989 | (JP) . |
| 1240674 | 9/1989 | (JP) . |
| 2125884 | 5/1990 | (JP) . |
| 3260095 | 11/1991 | (JP) . |
| 5070974 | 3/1993 | (JP) . |
| 5125553 | 5/1993 | (JP) . |
| 5140761 | 6/1993 | (JP) . |
| 5195252 | 8/1993 | (JP) . |
| 5279869 | 10/1993 | (JP) . |
| 5287585 | 11/1993 | (JP) . |
| 10310722 | 11/1998 | (JP) . |
| WO 94/18362 | 8/1994 | (WO) . |
| WO 97/40208 | 10/1997 | (WO) . |

OTHER PUBLICATIONS

Electrodeposition of Iron–Nickel Alloys In the Presence of Organic Additives—By B.N. Popov, S.N. Popova, Ken–Ming Yin and R.E. White—Mar. 1994.

Galvanostatic Pulse and Pulse Reverse Plating of Nickel–Iron Alloys from Electrolytes Containing Organic Compounds on a Rotating Disk Electrode—B.N. Popov, Ken–Ming Yin, and R.E. White, No date avail.

Galvanostatic Pulse and Pulse Reverse Plating of Zinc–Nickel Alloys form Sulfate Electrolytes on a Rotating Disc Electrode—B.N. Popov, M. Ramasubramanian, S.N. Popova, R.E. White and K–M Yin, No date avail.

(List continued on next page.)

*Primary Examiner*—Kathryn Gorgos
*Assistant Examiner*—Wesley A. Nicolas
(74) *Attorney, Agent, or Firm*—Michael K. Boyer

(57) ABSTRACT

The disclosure relates to a process for forming a deposit on the surface of a metallic or conductive surface. The process employs an electrolytic process to deposit a mineral containing coating or film upon a metallic or conductive surface.

30 Claims, 2 Drawing Sheets

U.S. PATENT DOCUMENTS

| | | | |
|---|---|---|---|
| 4,184,926 | | 1/1980 | Kozak . |
| 4,193,851 | | 3/1980 | Crawford et al. . |
| 4,222,779 | | 9/1980 | Bengali et al. . |
| 4,351,883 | | 9/1982 | Marcantonio et al. . |
| 4,367,099 | | 1/1983 | Lash et al. . |
| 4,599,371 | * | 7/1986 | Loch et al. ............................ 523/402 |
| 4,620,904 | * | 11/1986 | Kozak ................................. 205/321 |
| 4,645,790 | | 2/1987 | Frey et al. . |
| 4,705,576 | | 11/1987 | Klos et al. . |
| 4,756,805 | | 7/1988 | Terada et al. . |
| 4,786,336 | | 11/1988 | Schoener et al. . |
| 4,921,552 | | 5/1990 | Sander et al. . |
| 4,992,116 | | 2/1991 | Hallman . |
| 5,068,134 | | 11/1991 | Cole et al. . |
| 5,108,793 | | 4/1992 | van Ooij et al. . |
| 5,223,106 | * | 6/1993 | Gerace et al. ....................... 204/488 |
| 5,275,713 | | 1/1994 | Hradcovsky . |
| 5,283,131 | * | 2/1994 | Mori et al. ........................... 428/623 |
| 5,342,456 | | 8/1994 | Dolan . |
| 5,346,598 | * | 9/1994 | Riffe et al. .............................. 422/6 |
| 5,368,655 | | 11/1994 | Klos . |
| 5,380,374 | | 1/1995 | Tomlinson . |
| 5,478,655 | | 12/1995 | Sabata et al. . |
| 5,672,390 | | 9/1997 | Crews, IV et al. . |
| 5,876,517 | | 3/1999 | Jeannier . |
| 6,083,362 | | 7/2000 | Hryn et al. . |
| 6,083,374 | | 7/2000 | Kopp . |

OTHER PUBLICATIONS

Use of Underpotential Deposition of Zinc to Mitigate Hydrogen Absorption into Monel K500—G. Zheng, B.N. Popov, and R.E. White, No date avail.

Pretreatment of Metal for Coating. Ande, K., Matsushima, Y.—Journal Name: Bosei Kanri (Rust Prev. Control) 31, (7)—Jul. 1987. pp. 214–221. ISSN—0520–6340. Language Japanese and English translation.

Hogrefe, Andre Rene; Czank, Michael—Synthetic dipotassium zinc disilicate—Mineralogisches Inst., Univ. Kiel, Kiel, Germany, Acta Crystallogr., Sect. C: Cryst. Struct. Commun. (1995), C51(9), 1728–30. CODEN: ACSCEE ISSN: 0108–2701 Journal written in English. CAN 123:271293 AN 1995:840577 CAPLUS, No month avail.

Kharitonov, Yu. Ya.; Khomutov, N.E. and Akol'zin, A.P. (Mosk. Khim–Tekhnol. Inst., Moscow, USSR—Study of the react ion of iron hydroxides and oxides with sodium silicate and silicic acid solutions. Zascht, Met, 1978; 14(1):89–90, CODEN: ZAMEA9; ISSN:0044–1856, No month avail.

Development of a New Elect rodeposition Process for Plating of Zn–Ni–X (X=Cd, P) Alloys—I. Corrosion Characteristics of Zn–Ni–Cd Ternary Alloys—Anand Durairajan, Bala S. Haran, Ralph E. White and Branko N. Popov—Journal of The Electrochemical Society, 147 (5) S–2 Proof Pages (2000), No month avail.

Characterization of Hydrogen Permeation through Zinc–Nickel Alloys under Corroding Conditions: Mathematical Model and Experimental Study—M. Ramasubramanian, B.N. Popov, and R.E. White—J. Electrochem. Soc., vol. 145, No. 6, Jun. 1998 The Electrochemical Society, Inc.

A.E. Chmel—Effect of Zn2+ on the Correlation Radius in the Na2O–ZnO–SiO2 System—Inorganic Materials vol. 32, No. 3, 1996, pp. 321–322, No month avail.

Ing. J. Kohnen—Long Life corrosion Protection with Unorganic Zinc Silicates Verfahrenstechnik (Mainz), 1968; 2(5):217–20, No month avail.

Characterization of Hydrogen Permeation Through a Corrosion–Resistant Zinc–Nickel–Phosphorus Alloy, A. Durairajan, A. Krishniyer, B.S. Haran, R.E. White, and B.N. Popov—Corrosion—vol. 56, No. 3, No date avail.

Development of a New Electrodeposition Process for Plating of Zn–Ni–X (X=Cd, P) Alloys Permeation Characteristics of Zn–Ni–Cd Ternary Alloys—A. Durairajan, B.S. Haran, R.E. White, and B.N. Popov—Journal of the Electrochemical Society, 147 (12) S–2 (2000), No month avail.

Anomalous Codeposition of Fe–Ni Alloys and Fe–Ni–SiO$_2$ Composites under Potentiostatic Conditions—Experimental Study and Mathematical Model—M. Ramasubramanian, S. N. Popova, B. N. Popov, and R. E. White—J.Electrochem Soc., vol. 143, No. 7, Jul. 1996, The Electrochemical Society, Inc.

Electrodeposition & Characterization of a Corrosion Resistant Zinc–Nickel–Phosphorus Alloy, By A. Krishniyer, M. Ramasubramanian, B.N. Popov & R.E. White, Jan. 1999.

Ellipsometric and Raman Spectroscopic Study of Thermally Formed Films on Titanium, E. Hristova and Li. Arsov, B. N. Popov and R.E. White—J. Electrochem Soc., vol. 144, No. 7, Jul. 1997 The Electrochemical Society, Inc.

Mass transport effects on the electrodeposition of iron–nickel alloys at the presence of additives—K.M. Yin, J.H. Wei, J.R. Fu, B. N. Popov, S.N. Popova, R.E.White—Journal of Applied Electrochemistry 25 (1995) 543–555, No month avail.

* cited by examiner

ELECTROLYTIC PROCESS FOR FORMING A MINERAL

This Application is a continuation in part of U.S. patent application Ser. No. 09/369,780, filed on Aug. 06, 1999, now U.S. Pat. No. 6,153,080 that is a continuation in part of Ser. No. 09/122,002, filed on Jul. 24, 1998, now U.S. Pat. No. 6,258,243 that is a part of Ser. No. 09/016,250, filed on Jan. 30, 1998, now U.S. Pat. No. 6,149,794 in the names of Robert L. Heimann et al. and entitled "An Electrolytic Process For Forming A Mineral"; the entire disclosures of which are hereby incorporated by reference. The subject matter of this invention claims benefit under 35 U.S.C. 111(a), 35 U.S.C. 19(e) and 35 U.S.C. 120 of U.S. Provisional Patent Application Ser. No. 60/036,024, filed on Jan. 31, 1997 and Ser. No. 60/045,446, filed on May 2, 1997 and entitled "Non-Equilibrium Enhanced Mineral Deposition". The disclosure of the previously filed provisional patent applications is hereby incorporated by reference.

FIELD OF THE INVENTION

The instant invention relates to a process for forming a deposit on the surface of a metallic or conductive surface. The process employs an electrolytic process to deposit a mineral containing coating or film upon a metallic, metal containing or conductive surface.

BACKGROUND OF THE INVENTION

Silicates have been used in electrocleaning operations to clean steel, tin, among other surfaces. Electrocleaning is typically employed as a cleaning step prior to an electroplating operation. Using "Silicates As Cleaners In The Production of Tinplate" is described by L. J. Brown in February 1966 edition of *Plating*; hereby incorporated by reference.

Processes for electrolytically forming a protective layer or film by using an anodic method are disclosed by U.S. Pat. No. 3,658,662 (Casson, Jr. et al.), and United Kingdom Patent No. 498,485; both of which are hereby incorporated by reference.

U.S. Pat. No. 5,352,342 to Riffe, which issued on Oct. 4, 1994 and is entitled "Method And Apparatus For Preventing Corrosion Of Metal Structures" that describes using electromotive forces upon a zinc solvent containing paint; hereby incorporated by reference.

SUMMARY OF THE INVENTION

The instant invention solves problems associated with conventional practices by providing a cathodic method for forming a protective layer upon a metallic or metal containing substrate. The cathodic method is normally conducted by immersing an electrically conductive substrate into a silicate containing bath wherein a current is passed through the bath and the substrate is the cathode. A mineral layer comprising an amorphous matrix surrounding or incorporating metal silicate crystals can be formed upon the substrate. The characteristics of the mineral layer are described in greater detail in the copending and commonly assigned patent applications listed below. The mineral layer can impart improved corrosion resistance, increased electrical resistance, among other properties, to the underlying substrate.

The inventive process is a marked improvement over conventional methods by obviating the need for solvents or solvent containing systems to form a corrosion resistant layer, e.g., a mineral layer. In contrast, to conventional methods the inventive process is substantially solvent free. By "substantially solvent free" it is meant that less than about 5 wt. %, and normally less than about 1 wt. % volatile organic compounds (V.O.C.s) are present in the electrolytic environment.

The inventive process is also a marked improvement over conventional methods by reducing, if not eliminating, chromate and/or phosphate containing compounds. While the inventive process can be employed to enhance chromated or phosphated surfaces, the inventive process can replace these surfaces with a more environmentally desirable surface. The inventive process, therefore, can be "substantially chromate free" and "substantially phosphate free" and in turn produce articles that are also substantially chromate free and substantially phosphate free. By substantially chromate free and substantially phosphate free it is meant that less than 5 wt. % and normally about 0 wt. % chromates or phosphates are present in a process for producing an article or the resultant article. In addition to obviating chromate containing processes, the inventive method forms a layer having greater heat resistance than conventional chromate coatings. The improved heat resistance broadens the range of processes that can be performed subsequent to forming the inventive layer, e.g., heat cured topcoatings, stamping/shaping, among other processes.

In contrast to conventional electrocleaning processes, the instant invention employs silicates in a cathodic process for forming a mineral layer upon the substrate. Conventional electro-cleaning processes sought to avoid formation of oxide containing products such as greenalite whereas the instant invention relates to a method for forming silicate containing products, i.e., a mineral.

CROSS REFERENCE TO RELATED PATENTS AND PATENT APPLICATIONS

The subject matter of the instant invention is related to copending and commonly assigned Non-Provisional U.S. patent application Ser. Nos. 08/850,323; 08/850,586; and 09/016,853, filed respectively on May 2, 1997 and Jan. 30, 1998, and now U.S. Pat. Nos. 6,165,257; 6,143,420: 6,190, 779, respectively and Ser. No. 08/791,337 (filed on Jan. 31, 1997) now U.S. Pat. No. 5,938,976, in the names of Robert L. Heimann et al., as a continuation in part of Ser. No. 08/634,215 (filed on Apr. 18, 1996) now abandoned in the names of Robert L. Heimann et al., and entitled "Corrosion Resistant Buffer System for Metal Products", which is a continuation in part of Non-Provisional U.S patent application Ser. No. 08/476,271 (filed on Jun. 7, 1995), now abandoned, in the names of Heimann et al., and corresponding to WIPO Patent Application Publication No. WO 96/12770, which in turn is a continuation in part of Non-Provisional U.S. patent application Ser. No. 08/327,438 (filed on Oct. 21, 1994), now U.S. Pat. No. 5,714,093.

The subject matter of this invention is related to Non-Provisional patent application Ser. No. 09/016,849 which is currently pending, filed on Jan. 30, 1998 and entitled "Corrosion Protective Coatings". The subject matter of this invention is also related to Non-Provisional patent application Ser. No. 09/016,462, filed on Jan. 30, 1998 and entitled "Aqueous Gel Compositions and Use Thereof", now U.S. Pat. No. 6,033,495. The disclosure of the previously identified patents, patent applications and publications is hereby incorporated by reference.

DETAILED DESCRIPTION

Figure 1:
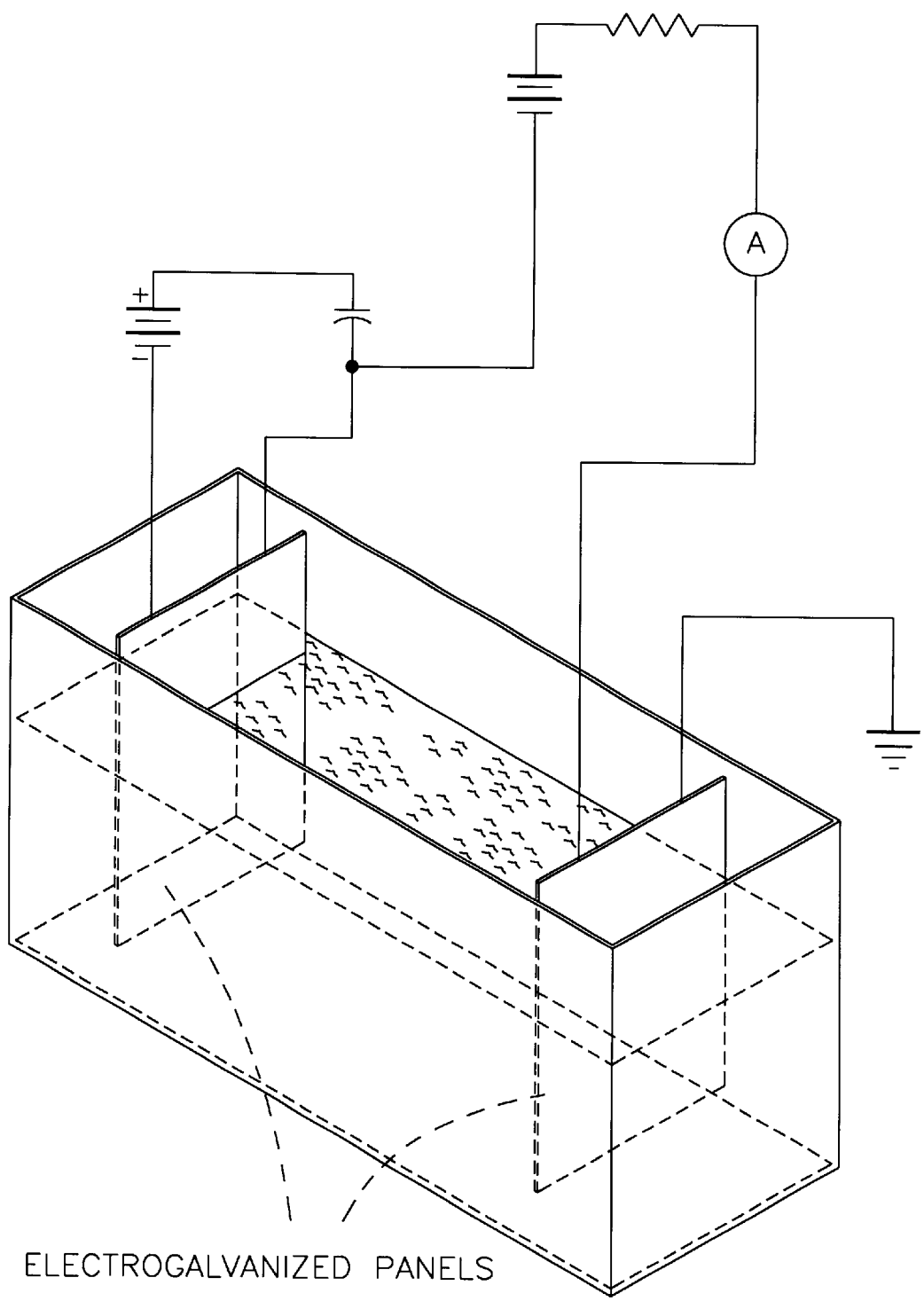
FIG. 1 is a schematic drawing of the circuit and apparatus which can be employed for practicing an aspect of the invention.

The instant invention relates to a process for depositing or forming a mineral containing coating or film upon a metallic or an electrically conductive surface. The process employs a mineral containing solution e.g., containing soluble mineral components, and utilizes an electrically enhanced method to obtain a mineral coating or film upon a metallic or conductive surface. By "mineral containing coating", "mineralized film" or "mineral" it is meant to refer to a relatively thin coating or film which is formed upon a metal or conductive surface wherein at least a portion of the coating or film includes at least one metal containing mineral, e.g., an amorphous phase or matrix surrounding or incorporating crystals comprising a zinc disilicate. Mineral and Mineral Containing are defined in the previously identified Copending and Commonly Assigned patents and patent applications; incorporated by reference. By "electrolytic" or "electrodeposition" or "electrically enhanced", it is meant to refer to an environment created by passing an electrical current through a silicate containing medium while in contact with an electrically conductive substrate and wherein the substrate functions as the cathode. By "metal containing", "metal", or "metallic", it is meant to refer to sheets, shaped articles, rods, particles, among other configurations that are based upon at least one metal and alloys including a metal having a naturally occurring, or chemically, mechanically or thermally modified surface. Typically a naturally occurring surface upon a metal will comprise a thin film or layer comprising at least one oxide.

The electrolytic environment can be established in any suitable manner including immersing the substrate, applying a silicate containing coating upon the substrate and thereafter applying an electrical current, among others. The preferred method for establishing the environment will be determined by the size of the substrate, electrodeposition time, among other parameters known in the electrodeposition art. The inventive process can be operated on a batch or continuous basis. The electrolytic environment can be preceded by or followed with conventional post and/or pre-treatments known in this art such as cleaning or rinsing, e.g., immersion/spray within the treatment, sonic cleaning, double counter-current cascading flow; alkali or acid treatments. By employing a suitable post-treatment the solubility, corrosion resistance, topcoat adhesion, among other properties of surface of the substrate formed by the inventive method can be improved. If desired, the post-treated surface can be topcoated, e.g., silane, epoxy, among other coatings.

In one aspect of the invention, the post treatment comprises exposing the substrate to a source of at least one carbonate or precursors thereof. Examples of carbonate comprise at least one member from the group of gaseous carbon dioxide, lithium carbonate, lithium bicarbonate, sodium carbonate, sodium bicarbonate, potassium carbonate, potassium bicarbonate, rubidium carbonate, rubidium bicarbonate, rubidium acid carbonate, cesium carbonate, ammonium carbonate, ammonium bicarbonate, ammonium carbamate and ammonium zirconyl carbonate. Normally, the carbonate source will be water soluble. One specific example of a suitable postreatment is disclosed in U.S. Pat. No. 2,462,763; hereby incorporated by reference. Another specific example of a post treatment comprises diluting ammonium zirconyl carbonate (1:4) in distilled water (e.g., Bacote® 20 supplied by Magnesium Elektron Corp). In the case of carbonate precursor such as carbon dioxide, the precursor can be passed through a liquid (including the silicate containing medium) and the substrate immersed in the liquid.

In another aspect of the invention, the post treatment comprises exposing the substrate to a source of at least one acid or precursors thereof. Examples of suitable acid sources comprise at least one member chosen from the group of phosphoric acid, hydrochloric acid, among other sources effective at improving at least one property of the treated metal surface. Normally, the acid source will be water soluble and be employed in amounts of up to 5 wt. % and typically, about 1 to about 2 wt. %.

The silicate containing medium can be a fluid bath, gel, spray, among other methods for contacting the substrate with the silicate medium. Examples of the silicate medium comprise a bath containing at least one silicate, a gel comprising at least one silicate and a thickener, among others. The medium can comprise a bath comprising at least one of potassium silicate, calcium silicate, sodium silicate, among other silicates. Normally, the bath comprises sodium silicate.

The silicate containing medium has a basic pH. Normally, the pH will range from greater than 9 to about 13 and typically, about 11.5. The medium is aqueous and comprises at least one water soluble silicate in an amount from greater than 0 to about 40 wt. %, usually, about 3 to 15 wt. % and typically about 10 wt. %. The aqueous medium can further comprise at least one water soluble dopant.

The metal surface refers to a metal article as well as a non-metallic or an electrically conductive member having an adhered metal or conductive layer. Examples of suitable metal surfaces comprise at least one member selected from the group consisting of galvanized surfaces, sheradized surfaces, zinc, iron, steel, brass, copper, nickel, tin, aluminum, lead, cadmium, magnesium, alloys thereof, among others. While the inventive process can be employed to coat a wide range of metal surfaces, e.g., copper, aluminum and ferrous metals, the mineral layer can be formed on a non-conductive substrate having at least one surface coated with an electrically conductive material, e.g., a metallized polymeric sheet or ceramic material encapsulated within a metal. Conductive surfaces can also include carbon or graphite as well as conductive polymers (polyaniline for example).

The metal surface can possess a wide range of sizes and configurations, e.g., fibers, drawn wires or wire strand/rope, rods, particles, fasteners, brackets, nuts, bolts, washers, among others. The limiting characteristic of the inventive process to treat a metal surface is dependent upon the ability of the electrical current to contact the metal surface. That is, similar to conventional electroplating technologies, a mineral surface may be difficult to apply upon a metal surface defining hollow areas or voids. This difficulty can be solved by using a conformal cathode.

The mineral coating can enhance the surface characteristics of the metal or conductive surface such as resistance to corrosion, protect carbon (fibers for example) from oxidation, stress crack corrosion (e.g., stainless steel), hardness and improve bonding strength in composite materials, and reduce the conductivity of conductive polymer surfaces including potential application in sandwich type materials.

The mineral coating can also affect the electrical and magnetic properties of the surface. That is, the mineral coating can impart electrical resistance or insulative properties to the treated surface. By having an electrically non-conductive surface, articles having the inventive layer can reduce, if not eliminate, electro-galvanic corrosion in fixtures wherein current flow is associated with corrosion, e.g., bridges, pipelines, among other articles.

In one aspect of the invention, the inventive process is employed for improving the cracking and oxidation resistance of aluminum, copper or lead containing substrates. For example, lead, which is used extensively in battery production, is prone to corrosion that in turn causes cracking, e.g., inter-granular corrosion. The inventive process can be employed for promoting grain growth of aluminum, copper and lead substrates as well as reducing the impact of surface flaws. Without wishing to be bound by any theory or explanation, it is believed that the lattice structure of the mineral layer formed in accordance with the inventive process on these 3 types of substrates would be a partially polymerized silicate. These lattices could incorporate a disilicate structure, or a chain silicate such as a pyroxene. A partially polymerized silicate lattice offers structural rigidity without being brittle. In order to achieve a stable partially polymerized lattice, metal cations would preferably occupy the lattice to provide charge stability. Aluminum has the unique ability to occupy either the octahedral site or the tetrahedral site in place of silicon. The +3 valence of aluminum would require additional metal cations to replace the +4 valance of silicon. In the case of lead application, additional cations could be, but are not limited to, a +2 lead ion.

In an aspect of the invention, an electrogalvanized panel, e.g., a zinc surface, is coated electrolytically by being placed into an aqueous sodium silicate solution. After being placed into the silicate solution, a mineral coating or film containing silicates is deposited by using low voltage and low current.

In one aspect of the invention, the metal surface, e.g., zinc, aluminum, steel, lead and alloys thereof; has an optional pretreated. By "pretreated" it is meant to refer to a batch or continuous process for conditioning the metal surface to clean it and condition the surface to facilitate acceptance of the mineral or silicate containing coating e.g., the inventive process can be employed as a step in a continuous process for producing corrosion resistant coil steel. The particular pretreatment will be a function of composition of the metal surface and desired composition of mineral containing coating/film to be formed on the surface. Examples of suitable pre-treatments comprise at least one of cleaning, e.g., sonic cleaning, activating, and rinsing. One suitable pretreatment process for steel comprises:

1) 2 minute immersion in a 3:1 dilution of Metal Prep 79 (Parker Amchem),
2) two deionized rinses,
3) 10 second immersion in a pH 14 sodium hydroxide solution,
4) remove excess solution and allow to air dry,
5) 5 minute immersion in a 50% hydrogen peroxide solution,
6) remove excess solution and allow to air dry.

In another aspect of the invention, the metal surface is pretreated by anodically cleaning the surface. Such cleaning can be accomplished by immersing the work piece or substrate into a medium comprising silicates, hydroxides, phosphates and carbonates. By using the work piece as the anode in a DC cell and maintaining a current of about 100 mA/cm2, the process can generate oxygen gas. The oxygen gas agitates the surface of the workpiece while oxidizing the substrate's surface. The surface can also be agitated mechanically by using conventional vibrating equipment. If desired, the amount of oxygen or other gas present during formation of the mineral layer can be increased by physi- cally introducing such gas, e.g., bubbling, pumping, among other means for adding gases.

In a further aspect of the invention, the silicate solution is modified to include one or more dopant materials. While the cost and handling characteristics of sodium silicate are desirable, at least one member selected from the group of water soluble salts, oxides and precursors of tungsten, molybdenum, chromium, titanium, zircon, vanadium, phosphorus, aluminum, iron, boron, bismuth, gallium, tellurium, germanium, antimony, niobium (also known as columbium), magnesium and manganese, mixtures thereof, among others, and usually, salts and oxides of aluminum and iron can be employed along with or instead of a silicate. The dopant can include fluorotitanic acid and salts thereof such as titanium hydrofluoride, ammonium fluorotitanate and sodium fluorotitanate; fluorozirconic acid and salts thereof such as $H_2ZrF_6$, $(NH_4)_2ZrF_6$ and $Na_2ZrF_6$; among others. The dopants that can be employed for enhancing the mineral layer formation rate, modifying the chemistry of the mineral layer, as a diluent for the electrolyte or silicate containing medium. Examples of such dopants are iron salts (ferrous chloride, sulfate, nitrate), aluminum fluoride, fluorosilicates (e.g., K2SiF6), fluoroaluminates (e.g., potassium fluoroaluminate such as K2AlF5—H20), mixtures thereof, among other sources of metals and halogens. The dopant materials can be introduced to the metal or conductive surface in pretreatment steps prior to electrodeposition, in post treatment steps following electrodeposition, and/or by alternating electrolytic contacts in solutions of dopants and solutions of silicates if the silicates will not form a stable solution with the dopants, e.g., one or more water soluble dopants. The presence of dopants in the electrolyte solution can be employed to form tailored mineral containing surfaces upon the metal or conductive surface, e.g., an aqueous sodium silicate solution containing aluminate can be employed to form a layer comprising oxides of silicon and aluminum.

The silicate solution can also be modified by adding water soluble polymers, and the electro-deposition solution itself can be in the form of a flowable gel consistency having a predetermined viscosity. A suitable composition can be obtained in an aqueous composition comprising about 3 wt % N-grade Sodium Silicate Solution (PQ Corp), optionally about 0.5 wt % Carbopol EZ-2 (BF Goodrich), about 5 to about 10 wt. % fumed silica, mixtures thereof, among others. Further, the aqueous silicate solution can be filled with a water dispersible polymer such as polyurethane to electro-deposit a mineral-polymer composite coating. The characteristics of the electro-deposition solution can be modified or tailored by using an anode material as a source of ions which can be available for codeposition with the mineral anions and/or one or more dopants. The dopants can be useful for building additional thickness of the electrodeposited mineral layer.

The following sets forth the parameters which may be employed for tailoring the inventive process to obtain a desirable mineral containing coating:

1. Voltage
2. Current Density
3. Apparatus or Cell Design
4. Deposition Time
5. Concentration of the N-grade sodium silicate solution
7. Type and concentration of anions in solution
8. Type and concentration of cations in solution
9. Composition/surface area of the anode
10. Composition/surface area of the cathode 11. Temperature
12. Pressure
13. Type and Concentration of Surface Active Agents The specific ranges of the parameters above depend on the substrate to be deposited on and the intended composition to be deposited. Normally, the temperature of the electrolyte bath ranges from about 25 to about 95 C., the voltage from about 12 to 24 volts, an electrolyte solution concentration from about 5 to about 15 wt. % silicate, contact time with the electrolyte from about 10 to about 50 minutes and anode to cathode surface area ratio of about 0.5:1 to about 2:1. Items 1, 2, 7, and 8 can be especially effective in tailoring the chemical and physical characteristics of the coating. That is, items 1 and 2 can affect the deposition time and coating thickness whereas items 7 and 8 can be employed for introducing dopants that impart desirable chemical characteristics to the coating. The differing types of anions and cations can comprise at least one member selected from the group consisting of Group I metals, Group II metals, transition and rare earth metal oxides, oxyanions such as molybdate, phosphate, titanate, boron nitride, silicon carbide, aluminum nitride, silicon nitride, mixtures thereof, among others.

The inventive process can also be modified by employing apparatus and methods conventionally associated with electroplating processes. Examples of such methods include pulse plating, adding electrolyte modifiers to the silicate containing medium, employing membranes within the bath, among other apparatus and methods.

The mineral layer as well as the mineral layer formation process can be modified by varying the composition of the anode. Examples of suitable anodes comprise platinum, zinc, steel, tantalum, niobium, titanium, Monel® alloys, alloys thereof, among others. The anode can release ions into the electrolyte bath that can become incorporated within the mineral layer. Normally, ppm concentrations of anode ions are sufficient to affect the mineral layer composition.

Figure 2:
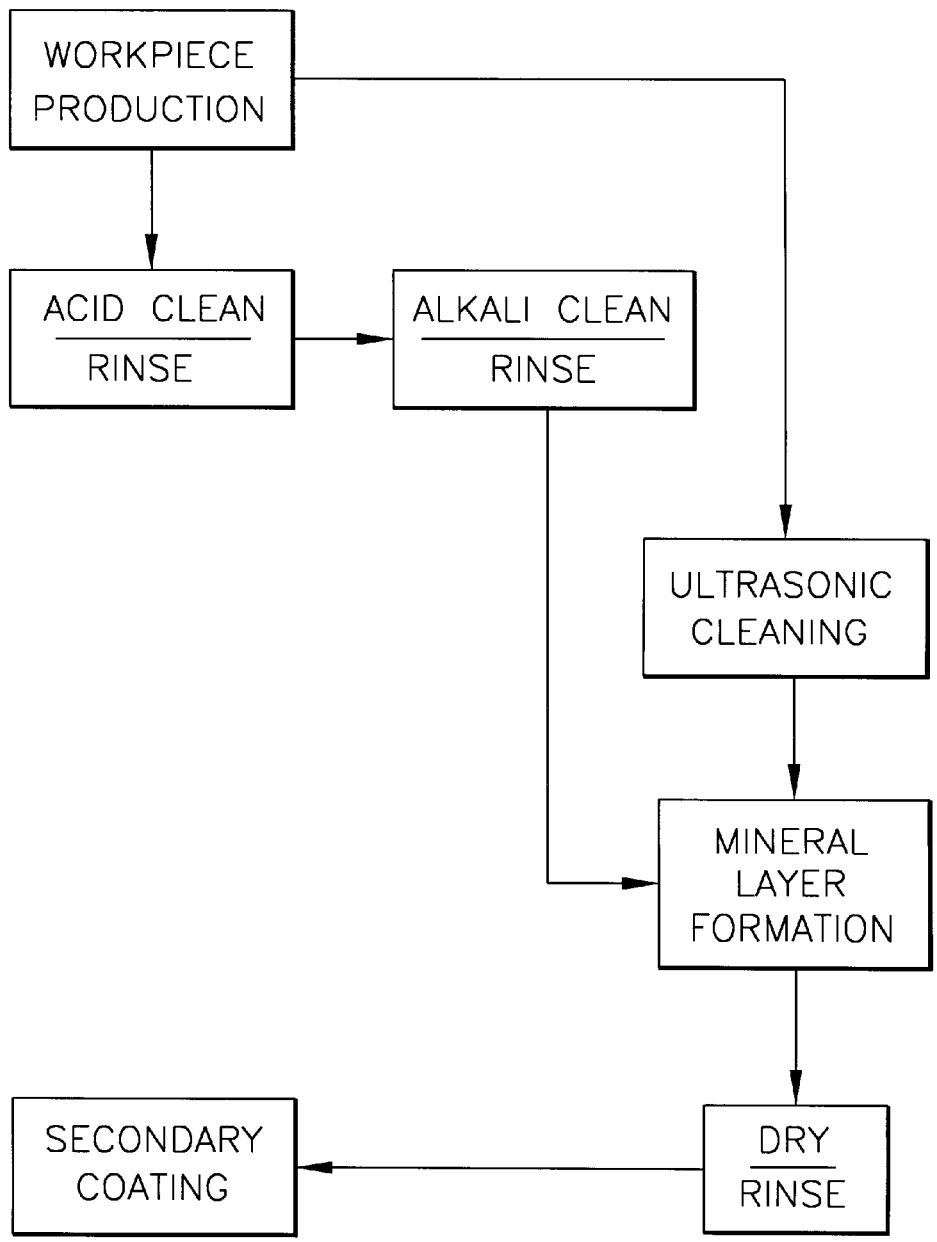
FIG. 2 is a schematic drawing of one process that employs the inventive electrolytic method.

The mineral layer formation process can be practiced in any suitable apparatus and methods. Examples of suitable apparatus comprise rack and barrel plating, brush plating, among other apparatus conventionally used in electroplating metals. The mineral layer formation process is better understood by referring to the drawings. Referring now to FIG. 2, FIG. 2 illustrates a schematic drawing of one process that employs the inventive electrolytic method. The process illustrated in FIG. 2 can be operated in a batch or continuous process. The articles having a metal surface to be treated (or workpiece) are first cleaned by an acid such as hydrochloric acid, rinsed with water, and rinsed with an alkali such as sodium hydroxide, rinsed again with water. The cleaning and rinsing can be repeated as necessary. If desired the acid/alkali cleaning can be replaced with a conventional sonic cleaning apparatus. The workpiece is then subjected to the inventive electrolytic method thereby forming a mineral coating upon at least a portion of the workpiece surface. The workpiece is removed from the electrolytic environment, dried and rinsed with water, e.g, a layer comprising, for example, silica and/or sodium carbonate can be removed by rinsing. Depending upon the intended usage of the dried mineral-coated workpiece, the workpiece can be coated with a secondary coating or layer. Examples of such secondary coatings or layers comprise one or more members of acrylic coatings (e.g., IRALAC), silanes, urethane, epoxies, silicones, alkyds, phenoxy resins (powdered and liquid forms), radiation curable coatings (e.g., UV curable coatings), among others. The secondary coatings can be applied by using any suitable conventional method such as immersing, dip-spin, spraying, among other methods. The secondary coatings can be cured by any suitable method such as UV exposure, heating, allowed to dry under ambient conditions, among other methods. The secondary coatings can be employed for imparting a wide range of properties such as improved corrosion resistance to the underlying mineral layer, a temporary coating for shipping the mineral coated workpiece, among other utilities. The mineral coated workpiece, with or without the secondary coating, can be used as a finished product or a component to fabricate another article.

Without wishing to be bound by any theory or explanation a silica containing layer can be formed upon the mineral. The silica containing layer can be chemically or physically modified and employed as an intermediate or tie-layer. The tie-layer can be used to enhance bonding to paints, coatings, metals, glass, among other materials contacting the tie-layer. This can be accomplished by binding to the top silica containing layer one or more materials which contain alkyl, fluorine, vinyl, epoxy including two-part epoxy and powder paint systems, silane, hydroxy, amino, mixtures thereof, among other functionalities reactive to silica or silicon hydroxide. Alternatively, the silica containing layer can be removed by using conventional cleaning methods, e.g, rinsing with de-ionized water. The silica containing tie-layer can be relatively thin in comparison to the mineral layer 100–500 angstroms compared to the total thickness of the mineral which can be 1500–2500 angstroms thick. If desired, the silica containing layer can be chemically and/or physically modified by employing the previously described post-treatments, e.g., exposure to at least one carbonate source. The post-treated surface can then be contacted with at least one of the aforementioned secondary coatings, e.g, a heat cured epoxy.

In another aspect, the mineral without or without the aforementioned silica layer functions as an intermediate or tie-layer for one or more secondary coatings, e.g., silane containing secondary coatings. Examples of such secondary coatings and methods that can be complimentary to the instant invention are described in U.S. Pat. Nos. 5,759,629; 5,750,197; 5,539,031; 5,498,481; 5,478,655; 5,455,080; and 5,433,976. The disclosure of each of these U.S. Patents is hereby incorporated by reference. For example, improved corrosion resistance of a metal substrate can be achieved by using a secondary coating comprising at least one suitable silane in combination with a mineralized surface. Examples of suitable silanes comprise at least one members selected from the group consisting of tetra-ortho-ethyl-silicate (TEOS), bis-1,2-(triethoxysilyl) ethane (BSTE), vinyl silane or aminopropyl silane, among other organo functional silanes. The silane can bond with the mineralized surface and then the silane can cure thereby providing a protective top coat, or a surface for receiving an outer coating or layer. In some cases, it is desirable to sequentially apply the silanes. For example, a steel substrate, e.g., a fastener, can be treated to form a mineral layer, allowed to dry, rinsed in deionized water, coated with a 5% BSTE solution, coated again with a 5% vinyl silane solution, and powder coated with a thermoset epoxy paint (Corvel 10–1002 by Morton) at a thickness of 2 mils. The steel substrate was scribed using a carbide tip and exposed to ASTM B117 salt spray for 500 hours. After the exposure, the substrates were removed and rinsed and allowed to dry for 1 hour. Using a spatula, the scribes were scraped, removing any paint due to undercutting, and the remaining gaps were measured. The tested substrates showed no measurable gap beside the scribe.

One or more outer coatings or layers can be applied to the secondary coating. Examples of suitable outer coatings comprise at least one member selected from the group consisting of acrylics, epoxies, urethanes, silanes, oils, gels, grease, among others. An example of a suitable epoxy comprises a coating supplied by The Magni® Group as B17 or B18 top coats, e.g, a galvanized article that has been treated in accordance with the inventive method and contacted with at least one silane and/or ammonium zirconium carbonate and top coated with a heat cured epoxy (Magni® B18) thereby providing a chromate free corrosion resistant article. By selecting appropriate secondary and outer coatings for application upon the mineral, a corrosion resistant article can be obtained without chromating or phosphating. Such a selection can also reduce usage of zinc to galvanize iron containing surfaces, e.g., a steel surface is mineralized, coated with a silane containing coating and with an outer coating comprising an epoxy.

While the above description places particular emphasis upon forming a mineral containing layer upon a metal surface, the inventive process can be combined with or replace conventional metal pre or post treatment and/or finishing practices. Conventional post coating baking methods can be employed for modifying the physical characteristics of the mineral layer, remove water and/or hydrogen, among other modifications. The inventive mineral layer can be employed to protect a metal finish from corrosion thereby replacing conventional phosphating process, e.g., in the case of automotive metal finishing the inventive process could be utilized instead of phosphates and chromates and prior to coating application e.g., E-Coat. Further, the aforementioned aqueous mineral solution can be replaced with an aqueous polyurethane based solution containing soluble silicates and employed as a replacement for the so-called automotive E-coating and/or powder painting process. The mineral forming process can be employed for imparting enhanced corrosion resistance to electronic components, e.g., such as the electric motor shafts as demonstrated by Examples 10–11. The inventive process can also be employed in a virtually unlimited array of end-uses such as in conventional plating operations as well as being adaptable to field service. For example, the inventive mineral containing coating can be employed to fabricate corrosion resistant metal products that conventionally utilize zinc as a protective coating, e.g., automotive bodies and components, grain silos, bridges, among many other end-uses.

Moreover, depending upon the dopants and concentration thereof present in the mineral deposition solution, the inventive process can produce microelectronic films, e.g., on metal or conductive surfaces in order to impart enhanced electrical/magnetic and corrosion resistance, or to resist ultraviolet light and monotomic oxygen containing environments such as outer space.

The following Examples are provided to illustrate certain aspects of the invention and it is understood that such an Example does not limit the scope of the invention as defined in the appended claims. The x-ray photoelectron spectroscopy (ESCA) data in the following Examples demonstrate the presence of a unique metal disilicate species within the mineralized layer, e.g., ESCA measures the binding energy of the photoelectrons of the atoms present to determine bonding characteristics.

EXAMPLE 1

The following apparatus and materials were employed in this Example:

Standard Electrogalvanized Test Panels, ACT Laboratories
10% (by weight) N-grade Sodium Silicate solution
12 Volt EverReady battery
1.5 Volt Ray-O-Vac Heavy Duty Dry Cell Battery
Triplett RMS Digital Multimeter
30 $\mu$F Capacitor
29.8 k$\Omega$ Resistor A schematic of the circuit and apparatus which were employed for practicing the Example are illustrated in FIG. 1. Referring now to FIG. 1, the aforementioned test panels were contacted with a solution comprising 10% sodium mineral and de-ionized water. A current was passed through the circuit and solution in the manner illustrated in FIG. 1. The test panels was exposed for 74 hours under ambient environmental conditions. A visual inspection of the panels indicated that a light-gray colored coating or film was deposited upon the test panel.

In order to ascertain the corrosion protection afforded by the mineral containing coating, the coated panels were tested in accordance with ASTM Procedure No. B117. A section of the panels was covered with tape so that only the coated area was exposed and, thereafter, the taped panels were placed into salt spray. For purposes of comparison, the following panels were also tested in accordance with ASTM Procedure No. B117, 1) Bare Electrogalvanized Panel, and 2) Bare Electrogalvanized Panel soaked for 70 hours in a 10% Sodium Mineral Solution. In addition, bare zinc phosphate coated steel panels(ACT B952, no Parcolene) and bare iron phosphate coated steel panels (ACT B1000, no Parcolene) were subjected to salt spray for reference.

The results of the ASTM Procedure are listed in the Table below:

| Panel Description | Hours in B117 Salt Spray |
| --- | --- |
| Zinc phosphate coated steel | 1 |
| Iron phosphate coated steel | 1 |
| Standard Bare Electrogalvanize Panel | ~120 |
| Standard Panel with Sodium Mineral Soak | ~120 |
| Coated Cathode of the Invention | 240+ |

The above Table illustrates that the instant invention forms a coating or film which imparts markedly improved corrosion resistance. It is also apparent that the process has resulted in a corrosion protective film that lengthens the life of electrogalvanized metal substrates and surfaces.

ESCA analysis was performed on the zinc surface in accordance with conventional techniques and under the following conditions:

Analytical conditions for ESCA:

| | |
| --- | --- |
| Instrument | Physical Electronics Model 5701 LSci |
| X-ray source | Monochromatic aluminum |
| Source power | 350 watts |
| Analysis region | 2 mm × 0.8 mm |
| Exit angle* | 50° |
| Electron acceptance angle | ±7° |
| Charge neutralization | electron flood gun |
| Charge correction | C—(C,H) in C 1s spectra at 284.6 eV |

*Exit angle is defined as the angle between the sample plane and the electron analyzer lens.

The silicon photoelectron binding energy was used to characterized the nature of the formed species within the mineralized layer that was formed on the cathode. This species was identified as a zinc disilicate modified by the presence of sodium ion by the binding energy of 102.1 eV for the Si(2p) photoelectron.

EXAMPLE 2

This Example illustrates performing the inventive electrodeposition process at an increased voltage and current in comparison to Example 1.

Prior to the electrodeposition, the cathode panel was subjected to preconditioning process:

1) 2 minute immersion in a 3:1 dilution of Metal Prep 79 (Parker Amchem),
2) two de-ionized rinse,
3) 10 second immersion in a pH 14 sodium hydroxide solution,
4) remove excess solution and allow to air dry,
5) 5 minute immersion in a 50% hydrogen peroxide solution,
6) Blot to remove excess solution and allow to air dry.

A power supply was connected to an electrodeposition cell consisting of a plastic cup containing two standard ACT cold roll steel (clean, unpolished) test panels. One end of the test panel was immersed in a solution consisting of 10% N grade sodium mineral (PQ Corp.) in de-ionized water. The immersed area (1 side) of each panel was approximately 3 inches by 4 inches (12 sq. in.) for a 1:1 anode to cathode ratio. The panels were connected directly to the DC power supply and a voltage of 6 volts was applied for 1 hour. The resulting current ranged from approximately 0.7–1.9 Amperes. The resultant current density ranged from 0.05–0.16 amps/in$^2$.

After the electrolytic process, the coated panel was allowed to dry at ambient conditions and then evaluated for humidity resistance in accordance with ASTM Test No. D2247 by visually monitoring the corrosion activity until development of red corrosion upon 5% of the panel surface area. The coated test panels lasted 25 hours until the first appearance of red corrosion and 120 hours until 5% red corrosion. In comparison, conventional iron and zinc phosphated steel panels develop first corrosion and 5% red corrosion after 7 hours in ASTM D2247 humidity exposure. The above Examples, therefore, illustrate that the inventive process offers an improvement in corrosion resistance over iron and zinc phosphated steel panels.

EXAMPLE 3

Two lead panels were prepared from commercial lead sheathing and cleaned in 6M HCl for 25 minutes. The cleaned lead panels were subsequently placed in a solution comprising 1 wt. % N-grade sodium silicate (supplied by PQ Corporation).

One lead panel was connected to a DC power supply as the anode and the other was a cathode. A potentional of 20 volts was applied initially to produce a current ranging from 0.9 to 1.3 Amperes. After approximately 75 minutes the panels were removed from the sodium silicate solution and rinsed with de-ionized water.

ESCA analysis was performed on the lead surface. The silicon photoelectron binding energy was used to characterized the nature of the formed species within the mineralized layer. This species was identified as a lead disilicate modified by the presence of sodium ion by the binding energy of 102.0 eV for the Si(2p) photoelectron.

EXAMPLE 4

This Example demonstrates forming a mineral surface upon an aluminum substrate. Using the same apparatus in Example 1, aluminum coupons (3"×6") were reacted to form the metal silicate surface. Two different alloys of aluminum were used, Al 2024 and Al7075. Prior to the panels being subjected to the electrolytic process, each panel was prepared using the methods outlined below in Table A. Each panel was washed with reagent alcohol to remove any excessive dirt and oils. The panels were either cleaned with Alumiprep 33, subjected to anodic cleaning or both. Both forms of cleaning are designed to remove excess aluminum oxides. Anodic cleaning was accomplished by placing the working panel as an anode into an aqueous solution containing 5% NaOH, 2.4% $Na_2CO_3$, 2% $Na_2SiO_3$, 0.6% $Na_3PO_4$, and applying a potential to maintain a current density of 100 mA/cm$^2$ across the immersed area of the panel for one minute.

Once the panel was cleaned, it was placed in a 1 liter beaker filled with 800 mL of solution. The baths were prepared using de-ionized water and the contents are shown in the table below. The panel was attached to the negative lead of a DC power supply by a wire while another panel was attached to the positive lead. The two panels were spaced 2 inches apart from each other. The potential was set to the voltage shown on the table and the cell was run for one hour.

TABLE A

| Example | A | B | C | D | E | F | G | H |
| --- | --- | --- | --- | --- | --- | --- | --- | --- |
| Alloy type | 2024 | 2024 | 2024 | 2024 | 7075 | 7075 | 7075 | 7075 |
| Anodic Cleaning | Yes | Yes | No | No | Yes | Yes | No | No |
| Acid Wash | Yes | Yes | Yes | Yes | Yes | Yes | Yes | Yes |
| Bath Solution | | | | | | | | |
| $Na_2SiO_3$ | 1% | 10% | 1% | 10% | 1% | 10% | 1% | 10% |
| $H_2O_2$ | 1% | 0% | 0% | 1% | 1% | 0% | 0% | 1% |
| Potential | 12 V | 18 V | 12 V | 18 V | 12 V | 18 V | 12 V | 18 V |

ESCA was used to analyze the surface of each of the substrates. Every sample measured showed a mixture of silica and metal silicate. Without wishing to be bound by any theory or explanation, it is believed that the metal silicate is a result of the reaction between the metal cations of the surface and the alkali silicates of the coating. It is also believed that the silica is a result of either excess silicates from the reaction or precipitated silica from the coating removal process. The metal silicate is indicated by a Si (2p) binding energy (BE) in the low 102 eV range, typically between 102.1 to 102.3. The silica can be seen by Si(2p) BE between 103.3 to 103.6 eV. The resulting spectra show overlapping peaks, upon deconvolution reveal binding energies in the ranges representative of metal silicate and silica.

EXAMPLE 5

This Example illustrates an alternative to immersion for creating the silicate containing medium.

An aqueous gel made by blending 5% sodium silicate and 10% fumed silica was used to coat cold rolled steel panels. One panel was washed with reagent alcohol, while the other panel was washed in a phosphoric acid based metal prep, followed by a sodium hydroxide wash and a hydrogen peroxide bath. The apparatus was set up using a DC power supply connecting the positive lead to the steel panel and the negative lead to a platinum wire wrapped with glass wool. This setup was designed to simulate a brush plating operation. The "brush" was immersed in the gel solution to allow for complete saturation. The potential was set for 12V and the gel was painted onto the panel with the brush. As the brush passed over the surface of the panel, hydrogen gas evolution could be seen. The gel was brushed on for five minutes and the panel was then washed with de-ionized water to remove any excess gel and unreacted silicates.

ESCA was used to analyze the surface of each steel panel. ESCA detects the reaction products between the metal substrate and the environment created by the electrolytic process. Every sample measured showed a mixture of silica and metal silicate. The metal silicate is a result of the reaction between the metal cations of the surface and the alkali silicates of the coating. The silica is a result of either excess silicates from the reaction or precipitated silica from the coating removal process. The metal silicate is indicated by a Si (2p) binding energy (BE) in the low 102 eV range, typically between 102.1 to 102.3. The silica can be seen by Si(2p) BE between 103.3 to 103.6 eV. The resulting spectra show overlapping peaks, upon deconvolution reveal binding energies in the ranges representative of metal silicate and silica.

EXAMPLE 6

Using the same apparatus described in Example 1, cold rolled steel coupons (ACT laboratories) were reacted to form the metal silicate surface. Prior to the panels being subjected to the electrolytic process, each panel was prepared using the methods outlined below in Table B. Each panel was washed with reagent alcohol to remove any excessive dirt and oils. The panels were either cleaned with Metalprep 79 (Parker Amchem), subjected to anodic cleaning or both. Both forms of cleaning are designed to remove excess metal oxides. Anodic cleaning was accomplished by placing the working panel as an anode into an aqueous solution containing 5% NaOH, 2.4% $Na_2CO_3$, 2% $Na_2SiO_3$, 0.6% $Na_3PO_4$, and applying a potential to maintain a current density of 100 mA/cm across the immersed area of the panel for one minute.

Once the panel was cleaned, it was placed in a 1 liter beaker filled with 800 mL of solution. The baths were prepared using de-ionized water and the contents are shown in the table below. The panel was attached to the negative lead of a DC power supply by a wire while another panel was attached to the positive lead. The two panels were spaced 2 inches apart from each other. The potential was set to the voltage shown on the table and the cell was run for one hour.

TABLE B

| Example | AA | BB | CC | DD | EE |
| --- | --- | --- | --- | --- | --- |
| Substrate type | CRS | CRS | CRS | CRS[1] | CRS[2] |
| Anodic Cleaning | No | Yes | No | No | No |
| Acid Wash | Yes | Yes | Yes | No | No |
| Bath Solution $Na_2SiO_3$ | 1% | 10% | 1% | — | — |
| Potential (V) | 14–24 | 6 (CV) | 12 V (CV) | — | — |
| Current Density $(mA/cm^2)$ | 23 (CC) | 23–10 | 85–48 | — | — |
| B177 | 2 hrs | 1 hr | 1 hr | 0.25 hr | 0.25 hr |

[1]Cold Rolled Steel Control- No treatment was done to this panel.
[2]Cold Rolled Steel with iron phosphate treatment (ACT Laboratories)- No further treatments were performed The electrolytic process was either run as a constant current or constant voltage experiment, designated by the CV or CC symbol in the table. Constant Voltage experiments applied a constant potential to the cell allowing the current to fluctuate while Constant Current experiments held the current by adjusting the potential. Panels were tested for corrosion protection using ASTM B117. Failures were determined at 5% surface coverage of red rust.

ESCA was used to analyze the surface of each of the substrates. ESCA detects the reaction products between the metal substrate and the environment created by the electrolytic process. Every sample measured showed a mixture of silica and metal silicate. The metal silicate is a result of the reaction between the metal cations of the surface and the alkali silicates of the coating. The silica is a result of either excess silicates from the reaction or precipitated silica from the coating removal process. The metal silicate is indicated by a Si (2p) binding energy (BE) in the low 102 eV range, typically between 102.1 to 102.3. The silica can be seen by Si(2p) BE between 103.3 to 103.6 eV. The resulting spectra show overlapping peaks, upon deconvolution reveal binding energies in the ranges representative of metal silicate and silica.

EXAMPLE 7

Using the same apparatus as described in Example 1, zinc galvanized steel coupons (EZG 60G ACT Laboratories) were reacted to form the metal silicate surface. Prior to the panels being subjected to the electrolytic process, each panel was prepared using the methods outlined below in Table C. Each panel was washed with reagent alcohol to remove any excessive dirt and oils.

Once the panel was cleaned, it was placed in a 1 liter beaker filled with 800 mL of solution. The baths were prepared using de-ionized water and the contents are shown in the table below. The panel was attached to the negative lead of a DC power supply by a wire while another panel was attached to the positive lead. The two panels were spaced approximately 2 inches apart from each other. The potential was set to the voltage shown on the table and the cell was run for one hour.

TABLE C

| Example | A1 | B2 | C3 | D5 |
| --- | --- | --- | --- | --- |
| Substrate type | GS | GS | GS | GS[1] |
| Bath Solution $Na_2SiO_3$ | 10% | 1% | 10% | — |
| Potential (V) | 6 (CV) | 10 (CV) | 18 (CV) | — |
| Current Density $(mA/cm^2)$ | 22–3 | 7–3 | 142–3 | — |
| B177 | 336 hrs | 224 hrs | 216 hrs | 96 hrs |

[1]Galvanized Steel Control- No treatment was done to this panel.

Panels were tested for corrosion protection using ASTM B117. Failures were determined at 5% surface coverage of red rust.

ESCA was used to analyze the surface of each of the substrates. ESCA detects the reaction products between the metal substrate and the environment created by the electrolytic process. Every sample measured showed a mixture of silica and metal silicate. The metal silicate is a result of the reaction between the metal cations of the surface and the alkali silicates of the coating. The silica is a result of either excess silicates from the reaction or precipitated silica from the coating removal process. The metal silicate is indicated by a Si (2p) binding energy (BE) in the low 102 eV range, typically between 102.1 to 102.3. The silica can be seen by Si(2p) BE between 103.3 to 103.6 eV. The resulting spectra show overlapping peaks, upon deconvolution reveal binding energies in the ranges representative of metal silicate and silica.

EXAMPLE 8

Using the same apparatus as described in Example 1, copper coupons (C110 Hard, Fullerton Metals) were reacted to form the mineralized surface. Prior to the panels being subjected to the electrolytic process, each panel was prepared using the methods outlined below in Table D. Each panel was washed with reagent alcohol to remove any excessive dirt and oils.

Once the panel was cleaned, it was placed in a liter beaker filled with 800 mL of solution. The baths were prepared using de-ionized water and the contents are shown in the table below. The panel was attached to the negative lead of a DC power supply by a wire while another panel was attached to the positive lead. The two panels were spaced 2 inches apart from each other. The potential was set to the voltage shown on the table and the cell was run for one hour.

TABLE D

| Example | AA1 | BB2 | CC3 | DD4 | EE5 |
|---|---|---|---|---|---|
| Substrate type | Cu | Cu | Cu | Cu | Cu[1] |
| Bath Solution $Na_2SiO_3$ | 10% | 10% | 1% | 1% | — |
| Potential (V) | 12 (CV) | 6 (CV) | 6 (CV) | 36 (CV) | — |
| Current Density ($mA/cm^2$) | 40–17 | 19–9 | 4–1 | 36–10 | — |
| B117 | 11 hrs | 11 hrs | 5 hrs | 5 hrs | 2 hrs |

[1]Copper Control- No treatment was done to this panel.

Panels were tested for corrosion protection using ASTM B117. Failures were determined by the presence of copper oxide which was indicated by the appearance of a dull haze over the surface.

ESCA was used to analyze the surface of each of the substrates. ESCA allows us to examine the reaction products between the metal substrate and the environment set up from the electrolytic process. Every sample measured showed a mixture of silica and metal silicate. The metal silicate is a result of the reaction between the metal cations of the surface and the alkali silicates of the coating. The silica is a result of either excess silicates from the reaction or precipitated silica from the coating removal process. The metal silicate is indicated by a Si (2p) binding energy (BE) in the low 102 eV range, typically between 102.1 to 102.3. The silica can be seen by Si(2p) BE between 103.3 to 103.6 eV. The resulting spectra show overlapping peaks, upon deconvolution reveal binding energies in the ranges representative of metal silicate and silica.

EXAMPLE 9

An electrochemical cell was set up using a 1 liter beaker. The beaker was filled with a sodium silicate solution comprising 10 wt % N sodium silicate solution (PQ Corp). The temperature of the solution was adjusted by placing the beaker into a water bath to control the temperature. Cold rolled steel coupons (ACT labs, 3×6 inches) were used as anode and cathode materials. The panels are placed into the beaker spaced 1 inch apart facing each other. The working piece was established as the anode. The anode and cathode are connected to a DC power source. The table below shows the voltages, solutions used, time of electrolysis, current density, temperature and corrosion performance.

TABLE E

| Sample # | Silicate Conc. Wt % | Bath Temp ° C. | Voltage Volts | Current Density $mA/cm^2$ | Bath Time min. | Corrosion Hours (B117) |
|---|---|---|---|---|---|---|
| I-A | 10% | 24 | 12 | 44-48 | 5 | 1 |
| I-B | 10% | 24 | 12 | 49-55 | 5 | 2 |
| I-C | 10% | 37 | 12 | 48-60 | 30 | 71 |
| I-D | 10% | 39 | 12 | 53-68 | 30 | 5 |
| I-F | 10% | 67 | 12 | 68-56 | 60 | 2 |
| I-G | 10% | 64 | 12 | 70-51 | 60 | 75 |
| I-H | NA | NA | NA | NA | NA | 0.5 |

The panels were rinsed with de-ionized water to remove any excess silicates that may have been drawn from the bath solution. The panels underwent corrosion testing according to ASTM B117. The time it took for the panels to reach 5% red rust coverage (as determined by visual observation) in the corrosion chamber was recorded as shown in the above table. Example I–H shows the corrosion results of the same steel panel that did not undergo any treatment.

EXAMPLE 10

Examples 10, 11, and 14 demonstrate one particular aspect of the invention, namely, imparting corrosion resistance to steel shafts that are incorporated within electric motors. The motor shafts were obtained from Emerson Electric Co. from St. Louis, Mo. and are used to hold the rotor assemblies. The shafts measure 25 cm in length and 1.5 cm in diameter and are made from commercially available steel.

An electrochemical cell was set up similar to that in Example 9; except that the cell was arranged to hold the previously described steel motor shaft. The shaft was set up as the cathode while two cold rolled steel panels were used as anodes arranged so that each panel was placed on opposite sides of the shaft. The voltage and temperature were adjusted as shown in the following table. Also shown in the table is the current density of the anodes

TABLE F

| Sample # | Silicate Conc. Wt % | Bath Temp ° C. | Voltage Volts | Current Density $mA/cm^2$ | Bath Time min. | Corrosion Hours |
|---|---|---|---|---|---|---|
| II-A | 10% | 27 | 6 | 17–9 | 60 | 3 |
| II-B | 10% | 60 | 12 | 47–35 | 60 | 7 |
| II-C | 10% | 75 | 12 | 59–45 | 60 | 19 |
| II-D | 10% | 93 | 12 | 99–63 | 60 | 24 |
| II-F | 10% | 96 | 18 | 90–59 | 60 | 24 |
| II-G | NA | NA | NA | NA | NA | 2 |
| II-H | NA | NA | NA | NA | NA | 3 |

The shafts were rinsed with de-ionized water to remove any excess silicates that may have been drawn from the bath solution. Example II-A showed no significant color change compared to Examples II-B–II-F due to the treatment. Example II-B showed a slight yellow/gold tint. Example II-C showed a light blue and slightly pearlescent color. Example II-D and II- showed a darker blue color due to the treatment. The panels underwent corrosion testing according to ASTM B117. The time it took for the shafts to reach 5% red rust coverage in the corrosion chamber was recorded as shown in the table. Example II-G shows the corrosion results of the same steel shaft that did not undergo any treatment and Example II-H shows the corrosion results of the same steel shaft with a commercial zinc phosphate coating.

EXAMPLE 11

An electrochemical cell was set up similar to that in Example 10 to treat steel shafts. The motor shafts were obtained from Emerson Electric Co. of St. Louis, Mo. and are used to hold the rotor assemblies. The shafts measure 25 cm in length and 1.5 cm in diameter and are made from commercially available steel. The shaft was set up as the cathode while two cold rolled steel panels were used as anodes arranged so that each panel was placed on opposite sides of the shaft. The voltage and temperature were adjusted as shown in the following table. Also shown in the table is the current density of the anodes

TABLE G

| Sample # | Silicate Conc. Wt % | Bath Temp °C. | Voltage Volts | Current Density mA/cm$^2$ | Bath Time min. | Corrosion Hours |
|---|---|---|---|---|---|---|
| III-A | 10% | 92 | 12 | 90–56 | 60 | 504 |
| III-B | 10% | 73 | 12 | 50–44 | 60 | 552 |
| III-C | NA | NA | NA | NA | NA | 3 |
| III-D | NA | NA | NA | NA | NA | 3 |

The shafts were rinsed with de-ionized water to remove any excess silicates that may have been drawn from the bath solution. The panels underwent corrosion testing according to ASTM D2247. The time it too for the shafts to reach 5% red rust coverage in the corrosion chamber was recorded as shown in the table. Example III-C shows the corrosion results of the same steel shaft that did not undergo any treatment and Example III-D shows the corrosion results of the same steel shaft with a commercial zinc phosphate coating.

EXAMPLE 12

An electrochemical cell was set up using a 1 liter beaker. The solution was filled with sodium silicate solution comprising 5,10, or 15 wt % of N sodium silicate solution (PQ Corporation). The temperature of the solution was adjusted by placing the beaker into a water bath to control the temperature. Cold rolled steel coupons (ACT labs, 3×6 inches) were used as anode and cathode materials. The panels are placed into the beaker spaced 1 inch apart facing each other. The working piece is set up as the anode. The anode and cathode are connected to a DC power source. The table below shows the voltages, solutions used, time of electrolysis, current density through the cathode, temperature, anode to cathode size ratio, and corrosion performance.

TABLE H

| Sample # | Silicate Conc. Wt % | Bath Temp °C. | Voltage Volts | Current Density mA/cm$^2$ | A/C ratio | Bath Time Min. | Corrosion Hours |
|---|---|---|---|---|---|---|---|
| IV-1 | 5 | 55 | 12 | 49–51 | 0.5 | 15 | 2 |
| IV-2 | 5 | 55 | 18 | 107-90 | 2 | 45 | 1 |
| IV-3 | 5 | 55 | 24 | 111-122 | 1 | 30 | 4 |
| IV-4 | 5 | 75 | 12 | 86-52 | 2 | 45 | 2 |
| IV-5 | 5 | 75 | 18 | 111-112 | 1 | 30 | 3 |
| IV-6 | 5 | 75 | 24 | 140-134 | 0.5 | 15 | 2 |
| IV-7 | 5 | 95 | 12 | 83-49 | 1 | 30 | 1 |
| IV-8 | 5 | 95 | 18 | 129-69 | 0.5 | 15 | 1 |
| IV-9 | 5 | 95 | 24 | 196-120 | 2 | 45 | 4 |
| IV-10 | 10 | 55 | 12 | 101-53 | 2 | 30 | 3 |
| IV-11 | 10 | 55 | 18 | 146-27 | 1 | 15 | 4 |
| IV-12 | 10 | 55 | 24 | 252-186 | 0.5 | 45 | 7 |
| IV-13 | 10 | 75 | 12 | 108-36 | 1 | 15 | 4 |
| IV-14 | 10 | 75 | 18 | 212-163 | 0.5 | 45 | 4 |
| IV-15 | 10 | 75 | 24 | 248-90 | 2 | 30 | 16 |
| IV-16 | 10 | 95 | 12 | 168-161 | 0.5 | 45 | 4 |
| IV-17 | 10 | 95 | 18 | 257-95 | 2 | 30 | 6 |
| IV-18 | 10 | 95 | 24 | 273-75 | 1 | 15 | 4 |
| IV-19 | 15 | 55 | 12 | 140-103 | 1 | 45 | 4 |
| IV-20 | 15 | 55 | 18 | 202-87 | 0.5 | 30 | 4 |
| IV-21 | 15 | 55 | 24 | 215-31 | 2 | 15 | 17 |
| IV-22 | 15 | 75 | 12 | 174-86 | 0.5 | 30 | 17 |
| IV-23 | 15 | 75 | 18 | 192-47 | 2 | 15 | 15 |
| IV-24 | 15 | 75 | 24 | 273-251 | 1 | 45 | 4 |
| IV-25 | 15 | 95 | 12 | 183-75 | 2 | 15 | 8 |
| IV-26 | 15 | 95 | 18 | 273-212 | 1 | 45 | 4 |
| IV-27 | 15 | 95 | 24 | 273-199 | 0.5 | 30 | 15 |
| IV-28 | NA | NA | NA | NA | NA | NA | 0.5 |

The panels were rinsed with de-ionized water to remove any excess silicates that may have been drawn from the bath solution. The panels underwent corrosion testing according to ASTM B117. The time it took for the panels to reach 5% red rust coverage in the corrosion chamber was recorded as shown in the table. Example IV-28 shows the corrosion results of the same steel panel that did not undergo any treatment. The table above shows the that corrosion performance increases with silicate concentration in the bath and elevated temperatures. Corrosion protection can also be achieved within 15 minutes. With a higher current density, the corrosion performance can be enhanced further.

EXAMPLE 13

An electrochemical cell was set up using a 1 liter beaker. The solution was filled with sodium silicate solution comprising 10 wt % N sodium silicate solution (PQ Corporation). The temperature of the solution was adjusted by placing the beaker into a water bath to control the temperature. Zinc galvanized steel coupons (ACT labs, 3×6 inches) were used as cathode materials. Plates of zinc were used as anode material. The panels are placed into the beaker spaced 1 inch apart facing each other. The working piece was set up as the anode. The anode and cathode are connected to a DC power source. The table below shows the voltages, solutions used, time of electrolysis, current density, and corrosion performance.

TABLE I

| Sample # | Silicate Conc. Wt % | Voltage Volts | Current Density mA/cm$^2$ | Bath Time min. | Corrosion (W) Hours | Corrosion (R) Hours |
|---|---|---|---|---|---|---|
| V-A | 10% | 6 | 33–1 | 60 | 16 | 168 |
| V-B | 10% | 3 | 6.5–1 | 60 | 17 | 168 |
| V-C | 10% | 18 | 107–8 | 60 | 22 | 276 |
| V-D | 10% | 24 | 260–7 | 60 | 24 | 276 |
| V-E | NA | NA | NA | NA | 10 | 72 |

The panels were rinsed with de-ionized water to remove any excess silicates that may have been drawn from the bath solution. The panels underwent corrosion testing according to ASTM B117. The time when the panels showed indications of pitting and zinc oxide formation is shown as Corrosion (W). The time it took for the panels to reach 5% red rust coverage in the corrosion chamber was recorded as shown in the table as Corrosion (R). Example V-E shows the corrosion results of the same steel panel that did not undergo any treatment.

EXAMPLE 14

An electrochemical cell was set up similar to that in Examples 10–12 to treat steel shafts. The motor shafts were obtained from Emerson Electric Co. of St. Louis, Mo. and are used to hold the rotor assemblies. The shafts measure 25 cm in length and 1.5 cm in diameter and the alloy information is shown below in the table. The shaft was set up as the cathode while two cold rolled steel panels were used as anodes arranged so that each panel was placed on opposite sides of the shaft. The voltage and temperature were adjusted as shown in the following table. Also shown in the table is the current density of the anodes

TABLE J

| # | Alloy | Silicate Conc. Wt % | Bath Temp °C. | Voltage Volts | Current Density mA/cm² | Bath Time min. | Corrosion Hours |
|---|---|---|---|---|---|---|---|
| VI-A | 1018 | 10% | 75 | 12 | 94-66 | 30 | 16 |
| VI-B | 1018 | 10% | 95 | 18 | 136-94 | 30 | 35 |
| VI-C | 1144 | 10% | 75 | 12 | 109-75 | 30 | 9 |
| VI-D | 1144 | 10% | 95 | 18 | 136-102 | 30 | 35 |
| VI-F | 1215 | 10% | 75 | 12 | 92-52 | 30 | 16 |
| VI-G | 1215 | 10% | 95 | 18 | 136-107 | 30 | 40 |

The shafts were rinsed with de-ionized water to remove any excess silicates that may have been drawn from the bath solution. The panels underwent corrosion testing according to ASTM B117. The time it took for the shafts to reach 5% red rust coverage in the corrosion chamber was recorded as shown in the table.

EXAMPLE 15

This Example illustrates using an electrolytic method to form a mineral surface upon steel fibers that can be pressed into a finished article or shaped into a preform that is infiltrated by another material.

Fibers were cut (0.20–0.26 in) from 1070 carbon steel wire, 0.026 in. diameter, cold drawn to 260,000–280,000 PSI. 20 grams of the fibers were placed in a 120 mL plastic beaker. A platinum wire was placed into the beaker making contact with the steel fibers. A steel square 1 in by 1 in, was held 1 inch over the steel fibers, and supported so not to contact the platinum wire. 75 ml of 10% solution of sodium silicate (N-Grade PQ corp) in deionized water was introduced into the beaker thereby immersing both the steel square and the steel fibers and forming an electrolytic cell. A 12 V DC power supply was attached to this cell making the steel fibers the cathode and steel square the anode, and delivered an anodic current density of up to about 3 Amps/sq. inch. The cell was placed onto a Vortex agitator to allow constant movement of the steel fibers. The power supply was turned on and a potential of 12 V passed through the cell for 5 minutes. After this time, the cell was disassembled and the excess solution was poured out, leaving behind only the steel fibers. While being agitated, warm air was blown over the steel particles to allow them to dry.

Salt spray testing in accordance with ASTM B-117 was performed on these fibers. The following table lists the visually determined results of the ASTM B-117 testing.

TABLE K

| Treatment | 1st onset of corrosion | 5% red coverage |
|---|---|---|
| UnCoated | 1 hour | 5 hours |
| Electrolytic | 24 hours | 60 |

EXAMPLES 16–24

The inventive process demonstrated in Examples 16–24 utilized a 1 liter beaker and a DC power supply as described in Example 2. The silicate concentration in the bath, the applied potential and bath temperature have been adjusted and have been designated by table L-A.

TABLE L-A

| Process | silicate conc. | Potential | Temperature | Time |
|---|---|---|---|---|
| A | 1 wt. % | 6 V | 25 C. | 30 min |
| B | 10% | 12 V | 75 C. | 30 min |
| C | 15% | 12 V | 25 C. | 30 min |
| D | 15% | 18 V | 75 C. | 30 min |

EXAMPLE 16

To test the effect of metal ions in the electrolytic solutions, iron chloride was added to the bath solution in concentrations specified in the table below. Introducing iron into the solution was difficult due to its tendency to complex with the silicate or precipitate as iron hydroxide. Additions of iron was also limited due to the acidic nature of the iron cation disrupting the solubility of silica in the alkaline solution. However, it was found that low concentrations of iron chloride (<0.5%) could be added to a 20% N silicate solution in limited quantities for concentrations less that 0.025 wt % FeC13 in a 10 wt % silicate solution. Table L shows a matrix comparing electrolytic solutions while keeping other conditions constant. Using an inert anode, the effect of the solution without the effect of any anion dissolution were compared.

TABLE L-B

| Process | Silicate conc (%) | Iron Conc (%) | Anode | 1st Red | Failure (5% red) |
|---|---|---|---|---|---|
| B | 10% | 0 | Pt | 2 hrs | 3 hrs |
| B | 10 | 0.0025 | Pt | 2 hrs | 3 hrs |
| B | 10 | 0.025 | Pt | 3 hrs | 7 hrs |
| B | 10 | 0 | Fe | 3 hrs | 7 hrs |
| B | 10 | 0.0025 | Fe | 2 hrs | 4 hrs |
| B | 10 | 0.025 | Fe | 3 hrs | 8 hrs |
| Control | N/A | N/A | N/A | 1 hr | 1 hr |
| Control | N/A | N/A | N/A | 1 hr | 1 hr |

Table L-B Results showing the inventive process at 12V for 30 minutes at 75C. in a 10% silicate solution. Anodes used are either a platinum net or an iron panel. The solution is a 10% silicate solution with 0–0.0025% iron chloride solution. Corrosion performance is measured in ASTM B117 exposure time.

The trend shows increasing amounts of iron doped into the bath solution using an inert platinum electrode will perform similarly to a bath without doped iron, using an iron anode. This Example demonstrates that the iron being introduced by the steel anode, which provides enhanced corrosion resistance, can be replicated by the introduction of an iron salt solution.

EXAMPLE 17

Without wishing to be bound by any theory or explanation, it is believed that the mineralization reaction mechanism includes a condensation reaction. The presence of a condensation reaction can be illustrated by a rinse study wherein the test panel is rinsed after the electrolytic treatment shown in Table M-A. Table M-A illustrates that corrosion times increase as the time to rinse also increases. It is believed that if the mineral layer inadequately cross-links or polymerizes within the mineral layer the mineral layer can be easily removed in a water rinse. Conversely, as the test panel is dried for a relatively long period of time, the corrosion failure time improves thereby indicating that a fully crossed-linked or polymerized mineral layer was formed. This would further suggest the possibility of a further reaction stage such as the cross-linking reaction.

The corrosion resistance of the mineral layer can be enhanced by heating. Table M-B shows the effect of heating on corrosion performance. The performance begins to decline after about 600F. Without wishing to be bound by any theory or explanation, it is believed that the heating initially improves cross-linking and continued heating at elevated temperatures caused the cross-linked layer to degrade.

TABLE M-A

| Time of rinse | Failure time |
| --- | --- |
| Immediately after process- still wet | 1 hour |
| Immediately after panel dries | 2 hour |
| 1 hour after panel dries | 5 hour |
| 24 hours after panel dries | 7 hour |

Table M-A—table showing corrosion failure time (ASTM B117) for steel test panel, treated with the CEM silicate, after being rinsed at different times after treatment.

TABLE M-B

| Process | Heat | Failure |
| --- | --- | --- |
| B | 72 F. | 2 hrs |
| B | 200 F. | 4 hrs |
| B | 300 F. | 4 hrs |
| B | 400 F. | 4 hrs |
| B | 500 F. | 4 hrs |
| B | 600 F. | 4 hrs |
| B | 700 F. | 2 hrs |
| B | 800 F. | 1 hr |
| D | 72 F. | 3 hrs |
| D | 200 F. | 5 hrs |
| D | 300 F. | 6 hrs |
| D | 400 F. | 7 hrs |
| D | 500 F. | 7 hrs |
| D | 600 F. | 7 hrs |
| D | 700 F. | 4 hrs |
| D | 800 F. | 2 hrs |

Table M-B—CEM treatment on steel substrates. Process B refers to a 12V, 30 minute cathodic mineralization treatment in a 10% silicate solution. Process D refers to a 18V, 30 minute, cathodic mineralization treatment in a 15% silicate solution. The failure refers to time to 5% red rust coverage in an ASTM B117 salt spray environment.

EXAMPLE 18

In this Example the binding energy of a mineral layer formed on stainless steel is analyzed. The stainless steel was a ANSI 304 alloy. The samples were solvent washed and treated using Process B (a 10% silicate solution doped with iron chloride, at 75C. at 12 V for 30 minutes). ESCA was performed on these treated samples in accordance with conventional methods. The ESCA results showed an Si(2p) binding energy at 103.4 eV.

The mineral surface was also analyzed by using Atomic Force Microscope (AFM). The surface revealed crystals were approximately 0.1 to 0.5 µm wide.

EXAMPLE 19

The mineral layer formed in accordance with Example 18-method B was analyzed by using Auger Electron Spectroscopy (AES) in accordance with conventional testing methods. The approximate thickness of the silicate layer was determined to be about 5000 angstroms (500 nm) based upon silicon, metal, and oxygen levels. The silica layer was less than about 500 angstroms (50 nm) based on the levels of metal relative to the amount of silicon and oxygen.

The mineral layer formed in accordance with Example 16 method B applied on a ANSI 304 stainless steel substrate. The mineral layer was analyzed using Atomic Force Microscopy (AFM) in accordance to conventional testing methods. AFM revealed the growth of metal silicate crystals (approximately 0.5 microns) clustered around the areas of the grain boundaries. AFM analysis of mineral layers of steel or zinc substrate did not show this similar growth feature.

EXAMPLE 20

This Example illustrates the affect of silicate concentration on the inventive process. The concentration of the electrolytic solution can be depleted of silicate after performing the inventive process. A 1 liter 10% sodium silicate solution was used in an experiment to test the number of processes a bath could undergo before the reducing the effectiveness of the bath. After 30 uses of the bath, using test panels exposing 15 in$^2$, the corrosion performance of the treated panels decreased significantly.

Exposure of the sodium silicates to acids or metals can gel the silicate rendering it insoluble. If a certain minimum concentration of silicate is available, the addition of an acid or metal salt will precipitate out a gel. If the solution is depleted of silicate, or does not have a sufficient amount, no precipitate should form. A variety of acids and metal salts were added to aliquots of an electrolytic bath. After 40 runs of the inventive process in the same bath, the mineral barrier did not impart the same level of protection. This Example illustrates that iron chloride and zinc chloride can be employed to test the silicate bath for effectiveness.

TABLE N

| Solution | | Run 0 | Run 10 | Run 20 | Run 30 | Run 40 |
| --- | --- | --- | --- | --- | --- | --- |
| 0.1% FeCl3 | 2 drops | – | – | – | – | – |
| | 10 drops | + | Trace | Trace | trace | trace |
| | 1 mL | + | + | + | + | trace |
| 10% FeCl3 | 2 drops | + | + | + | + | + |
| | 10 drops | Thick | Thick | Thick | not as thick | not as thick |
| 0.05% ZnSO4 | 2 drops | – | – | – | – | – |
| | 10 drops | – | – | – | – | – |
| 5% ZnSO4 | 2 drops | + | + | + | + | + |
| | 10 drops | + | + | + | + | finer |
| 0.1% ZnCl2 | 2 drops | + | + | + | + | – |
| | 10 drops | + | + | + | + | not as thick |
| 10% ZnCl2 | 2 drops | + | + | + | + | finer |
| | 10 drops | + | + | + | + | + |
| 0.1% HCl | 2 drops | – | – | – | – | – |
| | 10 drops | – | – | – | – | – |
| 10% HCl | 2 drops | – | – | – | – | – |
| | 10 drops | – | – | – | – | – |
| 0.1% K3Fe(CN)6 | 2 drops | – | – | – | – | – |
| | 10 drops | – | – | – | – | – |
| 10% K3Fe(CN)6 | 2 drops | – | – | – | – | – |
| | 10 drops | – | – | – | – | – |

Table N—A 50 ml sample of bath solution was taken every 5th run and tested using a ppt test. A "–" indicates no precipitation. a "+" indicates the formation of a precipitate.

EXAMPLE 21

This Example compares the corrosion resistance of a mineral layer formed in accordance with Example 16 on a zinc containing surface in comparison to an iron (steel) containing surface. Table O shows a matrix comparing iron (cold rolled steel-CRS) and zinc (electrogalzanized zinc-EZG) as lattice building materials on a cold rolled steel substrate and an electrozinc galvanized substrate. The results comparing rinsing are also included on Table O. Comparing only the rinsed samples, greater corrosion resistance is obtained by employing differing anode materials. The Process B on steel panels using iron anions provides enhanced resistance to salt spray in comparison to the zinc materials.

TABLE O

| Substrate | Anode | Treatment | Rinse | 1st White | 1st Red | Failure |
|---|---|---|---|---|---|---|
| CRS | Fe | B | None | | 1 | 2 |
| CRS | Fe | B | DI | | 3 | 24 |
| CRS | Zn | B | None | | 1 | 1 |
| CRS | Zn | B | DI | | 2 | 5 |
| EZG | Zn | B | None | 1 | 240 | 582 |
| EZG | Zn | B | DI | 1 | 312 | 1080 |
| EZG | Fe | B | None | 1 | 312 | 576 |
| EZG | Fe | B | DI | 24 | 312 | 864 |
| CRS | Control | Control | None | | 2 | 2 |
| EZG | Control | Control | None | 3 | 168 | 192 |

Table O—Results showing ASTM B 117 corrosion results for cathodic mineralization treated cold rolled steel and electrozinc galvanized steel panels using different anode materials to build the mineral lattice.

EXAMPLE 22

This Example illustrates using a secondary layer upon the mineral layer in order to provide further protection from corrosion (a secondary layer typically comprises compounds that have hydrophilic components which can bind to the mineral layer).

The electronic motor shafts that were mineralized in accordance with Example 10 were contacted with a secondary coating. The two coatings which were used in the shaft coatings were tetra-ethyl-ortho-silicate (TEOS) or an organofunctional silane (VS). The affects of heating the secondary coating are also listed in Table P-A and P-B. Table P-A and P-B show the effect of TEOS and vinyl silanes on the inventive B Process.

TABLE P-A

| Treatment | ED Time | Dry | Rinse | TEOS Dip | 150 C. Heat | 1st Red | Failure |
|---|---|---|---|---|---|---|---|
| B | 10 min | None | No | No | no | 3hrs | 5 hrs |
| B | 10 min | None | No | No | yes | 7 hrs | 10 hrs |
| B | 30 min | None | No | No | no | 3 hrs | 5 hrs |
| B | 30 min | None | No | No | yes | 6 hrs | 11 hrs |
| B | 10 min | Yes | No | Yes | no | 3 hrs | 3 hrs |
| B | 30 min | Yes | No | Yes | yes | 3 hrs | 4 hrs |
| B | 10 min | 1 hr | No | Yes | no | 1 hr | 3 hrs |
| B | 10 min | 1 hr | No | Yes | yes | 7 hrs | 15 hrs |
| B | 10 min | 1 hr | Yes | Yes | no | 5 hrs | 6 hrs |
| B | 10 min | 1 hr | Yes | Yes | yes | 3 hrs | 4 hrs |
| B | 10 min | 1 day | No | Yes | no | 3 hrs | 10 hrs |
| B | 10 min | 1 day | No | Yes | yes | 3 hrs | 17 hrs |
| B | 10 min | 1 day | Yes | Yes | no | 4 hrs | 6 hrs |
| B | 10 min | 1 day | Yes | Yes | yes | 3 hrs | 7 hrs |
| B | 30 min | 1 hr | No | Yes | no | 6 hrs | 13 hrs |
| B | 30 min | 1 hr | No | Yes | yes | 6 hrs | 15 hrs |
| B | 30 min | 1 hr | Yes | Yes | no | 3 hrs | 7 hrs |
| B | 30 min | 1 hr | Yes | Yes | yes | 2 hrs | 6 hrs |
| B | 30 min | 1 day | No | Yes | no | 6 hrs | 10 hrs |
| B | 30 min | 1 day | No | Yes | yes | 6 hrs | 18 hrs |

TABLE P-A-continued

| Treatment | ED Time | Dry | Rinse | TEOS Dip | 150 C. Heat | 1st Red | Failure |
|---|---|---|---|---|---|---|---|
| B | 30 min | 1 day | Yes | Yes | no | 6 hrs | 6 hrs |
| B | 30 min | 1 day | Yes | Yes | yes | 4 hrs | 7 hrs |
| Control | 0 | 0 | No | No | No | 5 hrs | 5 hrs |
| Control | 0 | 0 | No | No | No | 5 hrs | 5 hrs |

Table P-A— table showing performance effects of TEOS and heat on the B Process.

TABLE P-B

| Treatment | Rinse | Bake | Test | 1st Red | Failure |
|---|---|---|---|---|---|
| B | DI | No | Salt | 3 | 10 |
| B | DI | 150c | Salt | 3 | 6 |
| B | A151 | No | Salt | 4 | 10 |
| B | A151 | 150c | Salt | 2 | 10 |
| B | A186 | No | Salt | 4 | 12 |
| B | A186 | 150c | Salt | 1 | 7 |
| B | A187 | No | Salt | 2 | 16 |
| B | A187 | 150c | Salt | 2 | 16 |
| Control | None | None | Salt | 1 | 1 |

DI = deionized water
A151 = vinyltriethoxysilane (Witco)
A186 = Beta-(3,4-epoxycylcohexyl)-ehtyltrimethoxysilane (Witco)
A187 = Gammaglycidoxypropyl-trimethoxysilane (Witco)
Table P-B- Table showing the effects of vinyl silanes on Elisha B treatment Table P-A illustrates that heat treating improves corrosion resistance. The results also show that the deposition time can be shortened if used in conjunction with the TEOS. TEOS and heat application show a 100% improvement over standard Process B. The use of vinyl silane also is shown to improve the performance of the Process B. One of the added benefits of the organic coating is that it significantly reduces surface energy and repels water.

EXAMPLE 23

This Example illustrates evaluating the inventive process for forming a coating on bare and galvanized steel was evaluated as a possible phosphate replacement for E-coat systems. The evaluation consisted of four categories: applicability of E-coat over the mineral surface; adhesion of the E-coat; corrosion testing of mineral/E-coat systems; and elemental analysis of the mineral coatings. Four mineral coatings (Process A, B, C, D) were evaluated against phosphate controls. The e-coat consisted of a cathodically applied blocked isocyanate epoxy coating.

TABLE Q

| Process | SiO3 conc. | Potential | Temperature | Time |
|---|---|---|---|---|
| A | 1% | 6 V | 25 C. | 30 min |
| B | 10% | 12 V | 75 C. | 30 min |
| C | 15% | 12 V | 25 C. | 30 min |
| D | 15% | 18 V | 75 C. | 30 min |

It was found that E-coat could be uniformly applied to the mineral surfaces formed by processes A–D with the best application occurring on the mineral formed with processes A and B. It was also found that the surfaces A and B had no apparent detrimental effect on the E-coat bath or on the E-coat curing process. The adhesion testing showed that surfaces A, B, and D had improved adhesion of the E-coat to a level comparable with that of phosphate. Similar results were seen in surfaces C and D over galvanized steel. Surfaces B and D generally showed more corrosion resistance than the other variations evaluated.

To understand any relation between the coating and performance, elemental analysis was done. It showed that the depth profile of coatings B and D was significant, >5000 angstroms.

EXAMPLE 24

This Example demonstrates the affects of the inventive process on stress corrosion cracking. These tests were conducted to examine the influence of the inventive electrolytic treatments on the susceptibility of AISI 304 stainless steel coupons to stress cracking. The tests revealed improvement in pitting resistance for samples following the inventive process. Four corrosion coupons of AISI 304 stainless steel were used in the test program. One specimen was tested without surface treatment. Another specimen was tested following an electrolytic treatment of Example 16, method B.

The test specimens were exposed according to ASTM G48 Method A (Ferric Chloride Pitting Test). These tests consisted of exposures to a ferric chloride solution (about 6 percent by weight) at room temperature for a period of 72 hours.

The results of the corrosion tests are given in Table R. The coupon with the electrolytic treatment suffered mainly end grain attack as did the non-treated coupon.

TABLE R

Results of ASTM G48 Pitting Tests

| Max. Pit Depth (mils) | Pit Penetration Rate (mpy) | Comments |
| --- | --- | --- |
| 3.94 | 479 | Largest pits on edges. Smaller pits on surface. |

EXAMPLE 25

This example illustrates the improved adhesion and corrosion protection of the inventive process as a pretreatment for paint top coats. A mineral layer was formed on a steel panel in accordance to Example 16, process B. The treated panels were immersed in a solution of 5% bis-1,2-(triethoxysilyl) ethane (BSTE-Witco) allowed to dry and then immerse in a 2% solution of vinyltriethoxysilane (Witco) or 2% Gammaglycidoxypropyl-trimethoxysilane (Witco). For purposes of comparison, a steel panel treated only with BSTE followed by vinyl silane, and a zinc phosphate treated steel panel were prepared. All of the panels were powder coated with a thermoset epoxy paint (Corvel 10–1002 by Morton) at a thickness of 2 mils. The panels were scribed using a carbide tip and exposed to ASTM B 117 salt spray for 500 hours. After the exposure, the panels were removed and rinsed and allowed to dry for 1 hour. Using a spatula, the scribes were scraped, removing any paint due to undercutting, and the remaining gaps were measured. The zinc phosphate and BSTE treated panels both performed comparably showing an average gap of 23 mm. The mineralized panels with the silane post treatment showed no measurable gap beside the scribe. The mineralized process performed in combination with a silane treatment showed a considerable improvement to the silane treatment alone. This Example demonstrates that the mineral layer provides a surface or layer to which the BSTE layer can better adhere.

EXAMPLE 26

This Example illustrates that the inventive mineral layer formed upon a metal containing surface can function as an electrical insulator. A Miller portable spot welder model #AASW 1510 M/110 V input/4450 Secondary amp output was used to evaluate insulating properties of a mineral coated steel panel. Control panels of cold rolled steel (CRS), and 60 g galvanized steel were also evaluated. All panels were 0.032" thickness. Weld tips were engaged, and held for an approximately 5.0 second duration. The completed spot welds were examined for bonding, discoloration, and size of weld. The CRS and galvanized panels exhibited a good bond and had a darkened spot weld approximately 0.25" in diameter. The mineral coated steel panel did not conduct an amount of electricity sufficient to generate a weld, and had a slightly discolored 0.06" diameter circle.

EXAMPLE 27

This Example illustrates forming the inventive layer upon a zinc surface obtained by a commercially available sherardization process.

A 2 liter glass beaker was filled with 1900 mL of mineralizing solution comprising 10 wt. % N sodium silicate solution (PQ Corp.) and 0.001 wt. % Ferric Chloride. The solution was heated to 75 C. on a stirring hot plate. A watch glass was placed over the top of the beaker to minimize

| INITIAL WEIGHT (g) | WEIGHT AFTER TEST (g) | WEIGHT AFTER TEST CLEANED (g) | SCALE WEIGHT (g) | WEIGHT LOSS (g)* | SURFACE AREA (sq.in) | TIME (hrs) | DENSITY (g/cc) | CORR. RATE (mpy) |
| --- | --- | --- | --- | --- | --- | --- | --- | --- |
| 28,7378 | 28.2803 | 28.2702 | −0.4575 | 0.4676 | 4.75 | 72.0 | 7.80 | 93.663 | evaporative loss while the solution was heating up. Two standard ACT cold roll steel (100008) test panels (3 in.×6 in.×0.032 in.) were used as anodes and hung off of copper strip contacts hanging from a 3/16 in. diameter copper rod. The cathode was a Sherardized washer that was 1.1875 inches in diameter and 0.125 inches thick with a 0.5 inch center hole. The washer and steel anodes were connected to the power supply via wires with stainless steel gator clips. The power supply was a Hull Cell rectifier (Tri-Electronics). The washer was electrolytically treated for 15 minutes at a constant 2.5 volts (~1 A/sq. inch current density). The washer was allowed to dry at ambient conditions after removal from the CM bath. Subsequent salt spray testing (ASTM-B 117 Method) was performed and compared to an untreated control washer with results as follows:

| Sample | Hours to First Red Corrosion | Hours to 5% Red Corrosion |
|---|---|---|
| Control Washer | 144 | 192 |
| Mineralized Washer | 360 | 1416 |

EXAMPLE 28

This Example demonstrates using post-treatment process for improving the properties of the inventive layer.

A tank containing 25 gallons of mineralizing solution comprising 10 wt. % N with immersion heaters. Six standard ACT cold roll steel (100008) test panels (3 in.×6 in.×0.032 in.) were used as anodes and hung off of copper strip contacts hanging from a 3/16 in. diameter copper rod. The 3/16 inch copper rod contacted the 0.5 inch copper anode bus bar which was connected to the rectifier. Three standard ACT Electrogalvanized steel test panels (ACT E60 EZG 2 side 03×06×.030 inches) were hung between the two sets of three steel anodes with the anodes approximately 3 inches from the electrogalvanized steel test panels. The electrogalvanized steel panels were connected to the cathode bus bar. The Electrogalvanized test panels were treated for 15 minutes at a constant 12 volts. The current was initially approximately 40 amps and decayed to approximately 25 amps after 15 minutes of exposure. The panels were post treated in aqueous solutions as follows:

| Sample # | Immediate Rinse | Dry | Treatment Solution |
|---|---|---|---|
| 1 | No | Yes | Ammonium Zirconyl Carbonate (Bacote 20 Diluted 1:4) |
| 2 | Yes | No | Ammonium Zirconyl Carbonate (Bacote 20 Diluted 1:4) |
| 3 | No | Yes | Ammonium Zirconyl Carbonate (Bacote 20 Diluted 1:4) |
| 4 | No | Yes | 20 Vol % Phosphoric Acid |
| 5 | Yes | No | 20 Vol % Phosphoric Acid |
| 6 | No | Yes | None |
| 7 | No | Yes | 2.5 Vol % Phosphoric Acid |
| 8 | Yes | No | 2.5 Vol % Phosphoric Acid |
| 9 | No | Yes | None |
| 10 | No | Yes | 1.0 wt. % Ferric Chloride |
| 11 | Yes | No | 1.0 wt. % Ferric Chloride |
| 12 | No | Yes | 1.0 wt. % Ferric Chloride |

As indicated above, some of the samples were rinsed and then treated immediately and some of the samples were dried first and then treated with the indicated aqueous solution. After drying, samples 3, 6, 7 and 10 were spray painted with 2 coats of flat black (7776) Premium Rustolcum Protective Enamel. The final dry film coating thickness averaged 0.00145 inches. The painted test panels were allowed to dry at ambient conditions for 24 hours and then placed in humidity exposure (ASTM-D2247) for 24 hours and then allowed to dry at ambient conditions for 24 hours prior to adhesion testing. The treated panels were subjected to salt spray testing (ASTM-B117) or paint adhesion testing (ASTM D-3359) as indicated below:

| Sample # | % Paint Adhesion Loss | Hours To First B117 Red Corrosion | Hours To 5% B117 Red Corrosion |
|---|---|---|---|
| 1 | — | 288 | 456 |
| 2 | — | 168 | 216 |
| 3 | 0 | — | — |
| 4 | — | 144 | 216 |
| 5 | — | 96 | 120 |
| 6 | 100 | — | — |
| 7 | 15–35 | — | — |
| 8 | — | 72 | 96 |
| 9 | — | 192 | 288 |
| 10 | 15–35 | — | — |
| 11 | — | 168 | 168 |
| 12 | — | 72 | 96 |

The above results show that the ammonium zirconyl carbonate had a beneficial effect on both adhesion of subsequent coatings as well as an improvement in corrosion resistance of uncoated surfaces. The salt spray results indicate that the corrosion resistance was decreased by immediate rinsing and exposure to the strong phosphoric acid.

EXAMPLE 29

This Example demonstrates the affects of the inventive process on stress corrosion cracking. These tests were conducted to examine the influence of the inventive electrolytic treatments on the susceptibility of AISI 304 and 316 stainless steel coupons to stress cracking. The tests revealed improvement in pitting resistance for samples following the inventive process. Three corrosion coupons steel were included in each test group. The Mineralized specimen were tested following an electrolytic treatment of Example 16, method B (15 minutes).

The test specimens were exposed according to ASTM G48 Method A (Ferric Chloride Pitting Test). These tests consisted of exposures to a ferric chloride solution (about 6 percent by weight) at room temperature for a period of 72 hours.

The results of the corrosion tests are given in Table R. The coupon with the electrolytic treatment suffered mainly end grain attack as did the non-treated coupon. The results are as follows:

| Material | Mineral Treatment | Avg. Max. Pit Depth ($\mu M$) | Avg. of Ten Deepest Pits ($\mu M$) | Pit (pits/sq. cm) | Avg. Mass Loss (g/sq. cm) |
|---|---|---|---|---|---|
| AISI 304 | No | 2847 | 1310 | 4.1 | 0.034 |
| AISI 304 | Yes | 2950 | 1503 | 0.2 | 0.020 |
| AISI 316L | No | 2083 | 1049 | 2.5 | 0.013 |
| AISI 316L | Yes | 2720 | 760 | 0.3 | 0.005 |

The mineralizing treatment of the instant invention effectively reduced the number of pits that occurred.

EXAMPLE 30

This Example demonstrates the effectiveness of the inventive method on improving the crack resistance of the underlying substrate. Nine U-Bend Stress corrosion specimens made from AISI 304 stainless steel were subjected to a heat sensitization treatment at 1200 F. for 8 hours prior to applying the mineral treatment as described in Example 16, method B (5 and 15 minutes). Each test group contained three samples that were 8 inches long, two inches wide and ¹⁄₁₆ inches thick. After application of the mineral treatment, the samples were placed over a stainless steel pipe section and stressed. The exposure sequence was similar to that described in ASTM C692 and consisted of applying foam gas thermal insulation around the U-Bemd Specimens that conformed to their shape. One assembled, 2.473 g/L NaCl solution was continuously introduced to the tension surface of the specimens through holes in the insulation. The flow rate was regulated to achieve partial wet/dry conditions on the specimens. The pipe section was internally heated using a cartridge heater and a heat transfer fluid and test temperature controlled at 160 F. The test was run for a period of 100 hours followed by a visual examination of the test specimens with results as follows:

| Material | Mineral Treatment | Mineral Treatment Time (Minutes) | AVG. Number Of Cracks | Avg. Total Crack Length (In) |
| --- | --- | --- | --- | --- |
| AISI 304 | No | 0 | 8.7 | 1.373 |
| AISI 304 | Yes | 5 | 2.7 | 0.516 |
| AISI 304 | Yes | 15 | 4.3 | 1.330 |

The mineralization treatment of the instant invention effectively reduced the number and length of cracks that occurred.

The following is claimed:

1. An electrically enhanced method for treating an electrically conductive surface comprising:
   contacting at least a portion of the surface with an aqueous medium comprising at least one water soluble silicate and having a basic pH,
   establishing an electrolytic environment within the medium wherein the surface is employed as a cathode,
   introducing a current into the medium at a rate and period of time sufficient to cause hydrogen evolution at the cathode.

2. The method of claim 1 wherein the medium comprises a combination comprising water, at least one water soluble silicate, and at least one water soluble dopant.

3. The method of claim 2 wherein the medium is substantially chromate free.

4. The method of claim 2 wherein the medium comprises greater than 3 wt. % of at least one alkali silicate.

5. The method of claim 2 wherein said medium is substantially solvent free.

6. The method of claim 1 wherein further comprising a post-treatment comprising contacting with at least one source of carbonate.

7. The method of claim 6 wherein the source of at least one carbonate comprises at least one member chosen from the group of lithium carbonate, lithium bicarbonate, sodium carbonate, sodium bicarbonate, potassium carbonate, potassium bicarbonate, rubidium carbonate, rubidium bicarbonate, rubidium acid carbonate, cesium carbonate, ammonium carbonate, ammonium bicarbonate, ammonium carbamate and ammonium zirconyl carbonate.

8. The method of claim 7 wherein the carbonate source comprises ammonium zirconyl carbonate.

9. The method of claim 6 comprising applying at least one topcoating upon the post-treated surface.

10. The method of claim 1 wherein the silicate containing medium comprises sodium silicate.

11. The method of claim 1 wherein the surface comprises at least one member selected from the group consisting of lead, copper, zinc, aluminum, stainless steel and steel.

12. The method of claim 1 wherein the silicate containing medium comprises at least one member from the group consisting of a fluid bath, gel or spray.

13. The method of claim 1 further comprising a post-treatment comprising contacting with at least one source of an acid.

14. The method of claim 1 further comprising cleaning the surface prior to exposure to the electrolytic environment.

15. The method of claim 1 further comprising forming a secondary coating comprising at least one member chosen from the group of silanes, epoxies, silicone, urethanes and acrylics.

16. A cathodic method for forming a mineral coating upon a metal or an electrically conductive surface comprising:
   exposing the surface to an aqueous medium comprising at least one water soluble silicate wherein said medium has a basic pH,
   establishing an electrolytic environment within the medium wherein the surface is employed as a cathode,
   passing a current through the silicate medium and the surface for a period of time and under conditions sufficient to form a mineral coating upon the metal surface; and
   removing the mineral coated surface from the electrolytic environment.

17. The method of claim 16 further comprising forming a layer comprising silica upon the mineral.

18. The method of claim 16 wherein the silicate containing medium further comprises at least one dopant.

19. The method of claim 18 wherein the dopant comprises at least one member selected from the group consisting of molybdenum, chromium, titanium, zircon, vanadium, phosphorus, aluminum, iron, boron, bismuth, gallium, tellurium, germanium, antimony, niobium, magnesium, manganese, and their oxides and salts.

20. The method of claim 18 wherein the dopant comprises the anode of the electrolytic environment.

21. The method of claim 16 wherein the silicate containing medium further comprises a water dispersible polymer.

22. A method for treating an electrically conductive surface comprising:
   contacting at least a portion of the surface with an aqueous medium wherein said medium comprises water and at least one water soluble silicate dissolved therein and wherein said medium has a basic pH,
   introducing a current into the medium wherein said surface is employed as a cathode, and;
   recovering a treated surface by removing said surface from the medium.

23. A method for treating an electrically conductive surface comprising:
   contacting at least a portion of the surface with a substantially chromate free medium having a basic pH and comprising a combination comprising water and at least one water soluble silicate,
   supplying an electrical current to the medium having an anode and a cathode under conditions sufficient to cause hydrogen evolution at the cathode; wherein the surface is employed as the cathode.

24. The method of claim 23 comprising cleaning the surface prior to said contacting.

25. The method of claim 23 further comprising removing the surface from the medium and exposing the surface to at least one acid source or precursors thereof.

26. The method of claim 23 wherein the anode comprises at least one member selected from the group consisting of platinum, zinc, steel, tantalum, niobium, titanium, nickel and alloys thereof.

27. The method of claim 23 comprising placing the surface into a barrel prior to said contacting.

28. The method of claim 23 comprising placing the surface upon a rack prior to said contacting.

29. The method of claim 23 further comprising applying at least one coating.

30. The method of claim 23 wherein said medium further comprises at least one dopant.

* * * * *